(12) United States Patent
McConaghy

(10) Patent No.: US 8,332,188 B2
(45) Date of Patent: Dec. 11, 2012

(54) MODELING OF SYSTEMS USING CANONICAL FORM FUNCTIONS AND SYMBOLIC REGRESSION

(75) Inventor: Trent Lorne McConaghy, Beatty (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 999 days.

(21) Appl. No.: 11/682,089

(22) Filed: Mar. 5, 2007

(65) Prior Publication Data

US 2007/0208548 A1 Sep. 6, 2007

Related U.S. Application Data

(60) Provisional application No. 60/778,361, filed on Mar. 3, 2006.

(51) Int. Cl.
*G06F 17/10* (2006.01)
(52) U.S. Cl. ........................................................ 703/2
(58) Field of Classification Search .......... 703/2; 716/4, 716/5, 18
See application file for complete search history.

(56) References Cited

U.S. PATENT DOCUMENTS

| | | | | |
|---|---|---|---|---|
| 5,148,513 A * | 9/1992 | Koza et al. | ................ | 706/13 |
| 5,587,897 A * | 12/1996 | Iida | ................ | 700/28 |
| 5,651,099 A * | 7/1997 | Konsella | ................ | 706/13 |
| 5,781,430 A * | 7/1998 | Tsai | ................ | 700/28 |
| 5,867,397 A * | 2/1999 | Koza et al. | ................ | 703/14 |
| 6,230,497 B1 * | 5/2001 | Morris et al. | ................ | 62/3.7 |
| 6,286,135 B1 * | 9/2001 | Santhanam | ................ | 717/146 |
| 6,493,686 B1 * | 12/2002 | Francone et al. | ................ | 706/12 |
| 6,691,079 B1 * | 2/2004 | Lai et al. | ................ | 703/16 |
| 6,799,078 B1 * | 9/2004 | Berkooz et al. | ................ | 700/28 |
| 6,810,118 B1 * | 10/2004 | Martin | ................ | 379/221.08 |
| 6,810,372 B1 * | 10/2004 | Unnikrishnan et al. | ........ | 703/13 |
| 6,859,914 B2 | 2/2005 | McConaghy | | |
| 7,136,891 B2 * | 11/2006 | Bera | ................ | 708/490 |
| 7,162,402 B2 * | 1/2007 | Daems et al. | ................ | 703/13 |
| 7,363,281 B2 * | 4/2008 | Jin et al. | ................ | 706/13 |
| 7,406,399 B2 * | 7/2008 | Furem et al. | ................ | 702/182 |
| 7,428,514 B2 * | 9/2008 | Jin et al. | ................ | 706/13 |
| 7,444,271 B2 * | 10/2008 | Craske et al. | ................ | 703/2 |
| 7,478,028 B2 * | 1/2009 | Ho et al. | ................ | 703/14 |
| 7,493,295 B2 * | 2/2009 | Ayala | ................ | 706/26 |
| 7,630,928 B2 * | 12/2009 | Bonissone et al. | ........ | 705/36 R |
| 7,676,778 B2 * | 3/2010 | Arbel et al. | ................ | 716/134 |
| 2001/0028743 A1 * | 10/2001 | Kostrzewski et al. | ........ | 382/232 |
| 2002/0089500 A1 * | 7/2002 | Jennings et al. | ................ | 345/420 |
| 2002/0176624 A1 * | 11/2002 | Kostrzewski et al. | ........ | 382/173 |
| 2003/0055614 A1 * | 3/2003 | Pelikan et al. | ................ | 703/2 |
| 2003/0177105 A1 * | 9/2003 | Xiao et al. | ................ | 706/13 |

(Continued)

OTHER PUBLICATIONS

K. Deb et al., "A Fast Elitist Non-dominated Sorting Genetic Algorithm for Multiobjective Optimization: NSGA-II," Proc. PPSN VI, Sep. 2000, pp. 849-858.

(Continued)

*Primary Examiner* — Saif Alhija
*Assistant Examiner* — Kibrom Gebresilassie
(74) *Attorney, Agent, or Firm* — Louis B. Allard; Borden Ladner Gervais LLP

(57) ABSTRACT

An apparatus and method to generate and evolve canonical form expressions representing a characteristic of a given system. Static and dynamic behavior of non-linear electrical circuits can be modeled. Searching of canonical form expressions can use evolutionary algorithms, simulated annealing and Tabu searching.

22 Claims, 17 Drawing Sheets

U.S. PATENT DOCUMENTS

| | | | | |
|---|---|---|---|---|
| 2004/0030414 | A1* | 2/2004 | Koza et al. | 700/1 |
| 2004/0039716 | A1* | 2/2004 | Thompson | 706/13 |
| 2004/0044971 | A1* | 3/2004 | McConaghy | 716/2 |
| 2004/0117415 | A1* | 6/2004 | Bera | 708/200 |
| 2004/0191804 | A1* | 9/2004 | Alessi et al. | 435/6 |
| 2005/0010319 | A1* | 1/2005 | Patel et al. | 700/121 |
| 2005/0060130 | A1* | 3/2005 | Shapiro et al. | 703/2 |
| 2005/0138586 | A1* | 6/2005 | Hoppe et al. | 716/5 |
| 2005/0143845 | A1* | 6/2005 | Kaji | 700/28 |
| 2005/0159922 | A1* | 7/2005 | Hsiung et al. | 702/182 |
| 2005/0216182 | A1* | 9/2005 | Hussain et al. | 701/200 |
| 2005/0251373 | A1* | 11/2005 | Daems et al. | 703/2 |
| 2005/0256684 | A1* | 11/2005 | Jin et al. | 703/2 |
| 2005/0256814 | A1* | 11/2005 | Ayala | 706/13 |
| 2005/0257178 | A1* | 11/2005 | Daems et al. | 716/2 |
| 2006/0122525 | A1* | 6/2006 | Shusterman | 600/513 |
| 2006/0150160 | A1* | 7/2006 | Taft et al. | 717/126 |
| 2006/0200436 | A1* | 9/2006 | Zhou et al. | 706/13 |
| 2006/0212785 | A1* | 9/2006 | Watari | 714/792 |
| 2006/0225003 | A1* | 10/2006 | Agogino et al. | 716/1 |
| 2009/0013289 | A1* | 1/2009 | Arbel et al. | 716/2 |
| 2009/0077001 | A1* | 3/2009 | Macready et al. | 706/57 |
| 2009/0313201 | A1* | 12/2009 | Huelsman et al. | 706/47 |
| 2011/0035194 | A1* | 2/2011 | Morton | 703/2 |
| 2011/0035196 | A1* | 2/2011 | Morton | 703/2 |

OTHER PUBLICATIONS

A. Whigham, "Grammatically-based Genetic Programming," Proc. Workshop on GP: From Theory to Real-World Applications, J.R. Rosca, ed., 1995.

X. Hong et al., "A Robust Nonlinear Identification Algorithm Using Press Statistic and Forward Regression", IEEE Trans. Neural Networks 14(2), Mar. 2003, pp. 454-458.

Leyn, F. et al., "An Efficient DC Root Solving Algorithm with Guaranteed Convergence for Analog Integrated CMOS Circuits", Computer-Aided Design, 1998. ICCAD 98. Digest of Technical Papers. 1998 IEEE/ACM International Conference, Nov. 8-12, 1998, pp. 304-307.

W. Daems et al., "Simulation-based generation of posynomial performance models for the sizing of analog integrated circuits," IEEE Trans. CAD 22(5), May 2003, pp. 517-534.

W. Daems et al., "An efficient optimization-based technique to generate posynomial performance models for analog integrated circuits", Proc. DAC 02, Jun. 2002, pp. 431-436.

T. McConaghy et al., "Caffeine: Template-Free Symbolic Model Generation of Analog Circuits via Canonical Form Functions and Genetic Programming", Proc. Date 2005, Mar. 2005.

T. McConaghy et al., "Analysis of Simulation-Driven Numerical Performance Modeling Techniques for Application to Analog Circuit Optimization," Proc. ISCAS 05, May 2005.

T. McConaghyet al., "IBMG: Interpretable Behavioral Model Generator for Nonlinear Analog Circuits via Canonical Form Functions and Genetic Programming," Proc. ISCAS 05, May 2005.

E. Zitzler et al., "Comparison of Multiobjective Evolutionary Algorithms: Empirical Results," Evolutionary Computation 8 (2), Summer 2000, pp. 173-195.

D.E. Goldberg. Genetic Algorithms in Search, Optimization and Machine Learning. Addison-Wesley, 1989.

W.B. Langdon, R. Poli. Foundations of Genetic Programming. Springer, 2002.

R. Poli, J. Page, W. B. Langdon, "Smooth Uniform Crossover, Sub-Machine Code GP and Demes," Proc. Genetic and Ev. Comp. Conf. (GECCO), vol. 2, Jul. 1999, pp. 1162-1169.

V. Vassilev, J. Miller, "The Advantages of Landscape Neutrality in Digital Circuit Evolution," ICES, 2000, pp. 252-263.

W. Banzhaf, "Genotype-Phenotype Mapping and Neutral Variation—A Case Study in Genetic Programming," in Y. Davidor et al, eds., Proc. PPSN III, 1994, pp. 322-332.

G. Gielen, R.A. Rutenbar, "Computer aided design of analog and mixed-signal integrated circuits," Proc. of the IEEE vol. 88(12), 2000, pp. 1825-1849.

J. Roychowdhury, "Automated macromodel generation for electronic systems," Behavioral Modeling and Simulation, BMAS 2003, San Jose, CA, Oct. 7-8, 2003, pp. 11-16.

M. Rewienski, J. White, "A trajectory piecewise-linear approach to model order reduction and fast simulation of nonlinear circuits and micromachined devices," Proc. ICCAD 2001, San Jose, CA, 2001, pp. 252-257.

N. Dong, J.S. Roychowdhury, "Piecewise polynomial nonlinear model reduction," Design Automation Conference, Jun. 2-6, 2003, pp. 484-489.

J.R. Phillips, J. Afonso, A.L. Oliveira, L.M. Silveira, "Analog macromodeling using kernel methods," ICCAD 2003, pp. 446-453.

J.R. Phillips, "A statistical perspective on nonlinear model reduction," BMAS, Oct. 7-8, 2003, San Jose, CA, pp. 41-46.

D.E. Root, J. Wood, N. Tufillaro, "New techniques for nonlinear behavioral modeling of microwave/RF ICs from simulation and nonlinear microwave methods," Behavioral Modeling and Simulation, Oct. 6-8, 2002, pp. 71-74.

H. Cao, L. Kang, Y. Chen, J. Yu, "Evolutionary Modeling of Ordinary Differential Equations with Genetic Programming," Genetic Programming and Evolvable Machines 1(4), Oct. 2000, pp. 309-337.

W. B. Langdon, R. Poli, "Fitness Causes Bloat: Mutation," Lecture Notes in Comp. Sci. 1391, Springer, 1998, pp. 37-48.

J. Deveugele, M. Steyaert, "A 10b 250MS/s binary-weighted current-steering DAC", Solid-State Circuits Conference, IEEE International, Feb. 15-19, 2004, vol. 1, pp. 362-532.

Trent McConaghy et al., "Automation in Mixed-Signal Design: Challenges and Solutions in the Wake of the Nano Era", Proceedings of the 2006 International Conference on Computer-Aided Design, Nov. 5-9, 2006, San Jose, CA.

Trent McConaghy et al., "Canonical Form Function as a Simple Means for Genetic Programming to Evolve Human Interpretable Functions", Proceedings of the 2006 Genetic and Evolutionary Computation Conference, Jul. 8-12, 2006, Seattle Washington, pp. 885-862.

* cited by examiner $F(x) = -10.3 + 7.1/X_3$
$+ 1.8*X_1*Log(-1.9 + 8.0/X_1 + 1.4*X_2^3/X_3)$ $f(x) = -10.3 + 7.1/X_3$
$+ 1.8*X_1*(1.9 + 8.0/X_1 + 1.4*X_2/X_3)*(3.2 + 5.9*X_6^2/X_1)$

Fig. 13 (A)-(R)

MODELING OF SYSTEMS USING CANONICAL FORM FUNCTIONS AND SYMBOLIC REGRESSION

CROSS REFERENCE TO RELATED APPLICATIONS

This application claims the benefit of priority of U.S. Provisional Patent Application No. 60/778,361 filed Mar. 3, 2006, which is incorporated herein by reference. The applicant acknowledges the participation of K.U. Leuven Research and Development in the development of this invention.

FIELD OF THE INVENTION

The present invention relates generally to the modeling of systems. More particularly, the present invention relates to the modeling of electrical circuits and to the generation of symbolic expressions describing the performance parameters and behavior of such circuits.

BACKGROUND OF THE INVENTION

Modeling of electrical circuits using symbolic analysis based on a circuit's topology in order to obtain symbolic expressions of circuit parameters is known in the art. Although such modeling allows for fast model creation and simulation to produce predictive analyzable equations, it is not well suited for modeling nonlinear circuits. Further, if very good accuracy is required, the resulting symbolic expressions can become impossible to interpret.

Numerical analysis of electrical circuits is also well known in the art. This approach solves circuit equations extracted from a circuit's topology for a given set of conditions. The resulting output pertains to operating points of the circuit in question and/or to numerical waveforms. Although such approaches work for linear and nonlinear circuits alike, are easy to set-up and accurate, they don't produce any behavior model of the circuit and offer little insight to circuit designers.

Nonlinear regression analysis of electrical circuits is another known approach to modeling. This approach requires extensive simulation of the circuit for different circuit parameter values and the generation of a black box model such as, for example, a neural network model. Although this type of approach works for arbitrary nonlinear circuits, allows for fast model simulation, and can be accurate, the model creation is time-consuming and the approach itself does not produce symbolic expressions.

Another known approach to circuit modeling is that of symbolic modeling using templates for the symbolic expressions used in describing characteristics of a given circuit. This approach requires extensive simulation of the circuit for different circuit parameter values and the generation of a model based on a functional template. An instance of such an approach uses posynomials in its functional template. Such an approach provides symbolic expressions, works for arbitrary nonlinear circuits, allows for fast simulation and can be somewhat accurate. However, questions remain as how to choose the template. Further, in addition to the time-consuming task of model creation, the accuracy of posynomial-based models can be poor and the resulting expressions are too big to be interpretable.

The approaches described above deal mainly with modeling static models of electrical circuits. However, several approaches in modeling the dynamic behavior of electrical circuits are also known. Such approaches include manual behavior model design, Model Order Reduction, numerical simulation and nonlinear regressions. Creating such models can take weeks to years and even then, a model's validity can become obsolete as new technologies emerge.

It is, therefore, desirable to provide a circuit modeling approach that produces symbolic expressions of circuit parameters that are interpretable, accurate and adaptable to emerging technologies.

SUMMARY OF THE INVENTION

It is an object of the present invention to obviate or mitigate at least one disadvantage of the prior art.

In a first aspect, the present invention provides a method to generate at least one expression describing a characteristic of a system, the system associated with variables and with pre-determined data related to the characteristic of the system. The method comprises steps of generating at least one initial expression having a pre-defined canonical form and being a function of the variables, and generating calculated data using the at least one initial expression.

The method further comprises steps of calculating an output of a goal function in accordance with the pre-determined data and the calculated data and, if the output of the goal function is outside a pre-defined range, iteratively: modifying the at least one initial expression in accordance with a search algorithm to produce at least one modified expression having the canonical form and being a function of the variables; generating additional calculated data using the at least one modified expression; and calculating an additional output of the goal function based on the additional calculated data and the pre-determined data, until the additional output of the goal function is within the pre-defined range.

In a further aspect, there is provided a method to generate at least one expression describing a transient behavior of a system, the system associated with at least one pre-determined transient input waveform and with at least one pre-determined transient output waveform. The method comprises steps of generating at least one initial expression having a pre-defined canonical form and being a function of at least one of the at least one pre-determined transient input waveform and the at least one pre-determined transient output waveform, generating calculated data using the at least one initial expression and, calculating an output of a goal function in accordance with the pre-determined data and the calculated data.

The method further comprises steps of, if the output of the goal function is outside a pre-defined range, iteratively: modifying the at least one initial expression in accordance with a search algorithm to produce at least one modified expression having the canonical form and being a function of at least one of the at least one pre-determined transient input waveform and the at least one pre-determined transient output waveform; generating additional calculated data using the at least one modified expression; and calculating an additional output of the goal function based on the additional calculated data and the pre-determined data, until the additional output of the goal function is within the pre-defined range.

In a further aspect, the present invention provides a method to model an electrical circuit, the electrical circuit associated with circuit variables, with pre-determined data, with at least one pre-determined transient input waveform and with at least one pre-determined transient output waveform. The method comprises steps of: generating at least one initial expression dependent on at least one of at least one of the variables, at least one of the at least one pre-determined transient input waveform and at least one of the least one pre-determined transient output waveform, the at least one initial expression having a pre-defined canonical form and generating calculated data using the at least one initial expression.

The method further comprises steps of calculating an output of a goal function in accordance with the pre-determined data and the calculated data; and if the output of the goal function is outside a pre-defined range, iteratively: modifying the at least one initial expression in accordance with a search algorithm to produce at least one modified expression dependent on at least one of at least one of the variables, at least one of the at least one pre-determined transient input waveform and at least one of the least one pre-determined transient output waveform, the at least one modified expression having the canonical form; generating additional calculated data using the at least one modified expression; and calculating an additional output of the goal function based on the additional calculated data and the pre-determined data, until the additional output of the goal function is within the pre-defined range.

In yet a further aspect, the present invention provides an apparatus to provide a symbolic expression representing a characteristic of a system, the system associated with system variables and with pre-determined data related to the characteristic of the system. The apparatus comprises: a generation and evolution (GE) module to generate and to evolve symbolic expressions having a pre-defined canonical form and a first database in communication with the GE module, the first database storing rules regarding the pre-defined canonical form.

The apparatus also comprises a second database in communication with the GE module, the second database storing pre-defined operators for use in generating and evolving the symbolic expressions; an input connected to the GE module, the input to provide the system variables to the GE module, the GE module generating and evolving the symbolic expressions in accordance with the rules regarding the canonical form and with the pre-defined operators; a goal function output calculator and evaluator (GFOCE) in communication with the GE module; a data input in communication with the GFOCE, the data input to provide the pre-determined data to the GFOCE; a goal function input in communication with the GFOCE, the goal function input to provide a goal function to the GFOCE, the GFOCE for calculating an output of the goal function and for comparing the output with a pre-determined target; and an exit port in communication with the GFOCE and with the GE module, the exit port to provide the output of the goal function and the symbolic expression corresponding to the output of the goal function upon the output of the goal function concording with the pre-determined target.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a system and method for generating human-interpretable symbolic expressions of performance characteristics of a system, without the use of pre-determined templates for the symbolic expressions. Any sufficiently general search algorithm, such as, for example, genetic programming, simulated annealing and Tabu searching can be used. Canonical form functions are used in the search for the symbolic expressions. In the case of genetic programming, it is used to traverse the space of possible symbolic expressions, and a set of rules is used to constrain the search to expressions having a pre-defined canonical form.

Embodiments of the invention are shown in relation to non-linear electrical circuits and symbolic expressions describing their static and dynamic behavior. However, as a worker skilled in the art will understand, the method and system of the present invention is also applicable to systems other than electrical systems. For example, financial systems and weather systems, amongst others, can also use the method and system described herein.

The problem to be addressed can be formulated as follows. Given a set of data regarding a performance characteristic of a system, determine a symbolic expression describing the performance characteristic in question, with the expression satisfying given criteria regarding predictability error and complexity.

Figure 1:
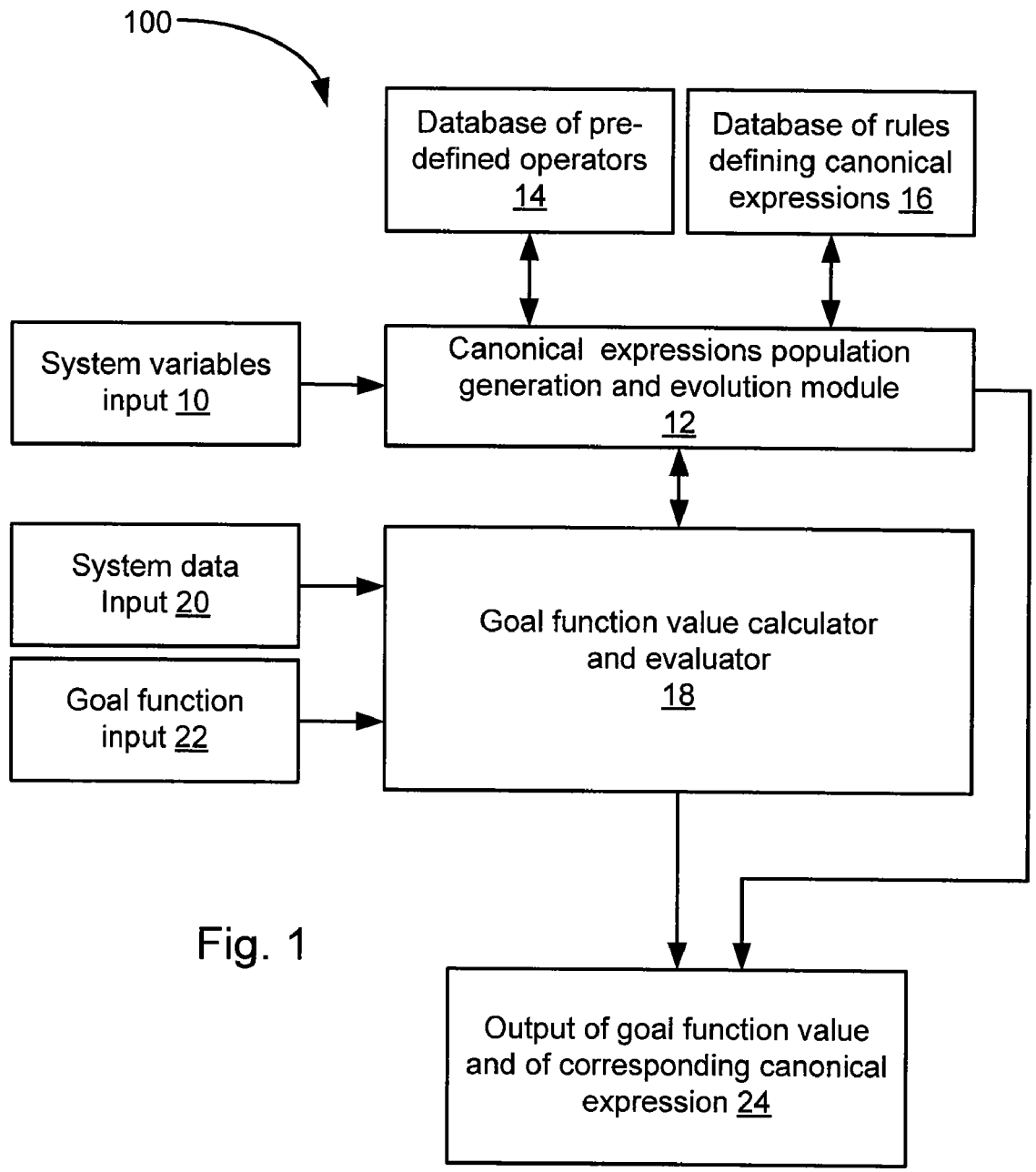
FIG. 1 shows an embodiment of an apparatus of the present invention used in generating and evolving symbolic expressions.

FIG. 1 shows an embodiment of an apparatus 100 of the present invention as applicable to genetic programming, the apparatus 100 for producing symbolic expressions defining a characteristic of a given system. For example, as will be seen in more detail below, the given system can be an electrical circuit and the characteristic of interest can be the low frequency gain of the circuit. As will be understood by a worker skilled in the art, the apparatus 100 can be readily adapted to implement any type of sufficiently general search algorithm such as, for example, simulated annealing and Tabu searching. The apparatus 100 comprises an input 10 for inputting the variables of the system into a generation and evolution (GE) module 12, which is designed to generate and evolve symbolic expressions defining the characteristic of interest. The variables can be design variable, environmental variables, random variables or any other suitable variables.

The GE module 12 is in communication with a database 14 containing predefined operators that can be used in generating and evolving symbolic expressions, the operators operating on the system variables. Such operators can include, e.g., single-input operators such as: x, $\log_e(x)$, $\log_{10}(x)$, 1/x, abs(x), $x_2$, sin(x), cos(x), tan(x), max(0, x), and min(0,x), 2x, 10x, where x is an expression; double-input operators can include $x_1+x_2$, $x_1*x_2$, max($x_1,x_2$), min($x_1,x_2$), power($x_1,x_2$), and $x_1/x_2$, where $x_1$ and $x_2$ are expressions. Also, "if then else" (Ite) expressions such as, e.g., Ite(testExpr, condExpr, exprIfTestLessThanCond, elseExpr) and Ite(testExpr, 0, exprIfTestLessThan 0, elseExpr), where "Expr" is an expression, can be used. Any input variable could have an exponent in the range { . . . ,−2, −1, 1, 2, . . . }. While real-valued exponents can also be used, but they tend to harm interpretability.

Figure 2A:
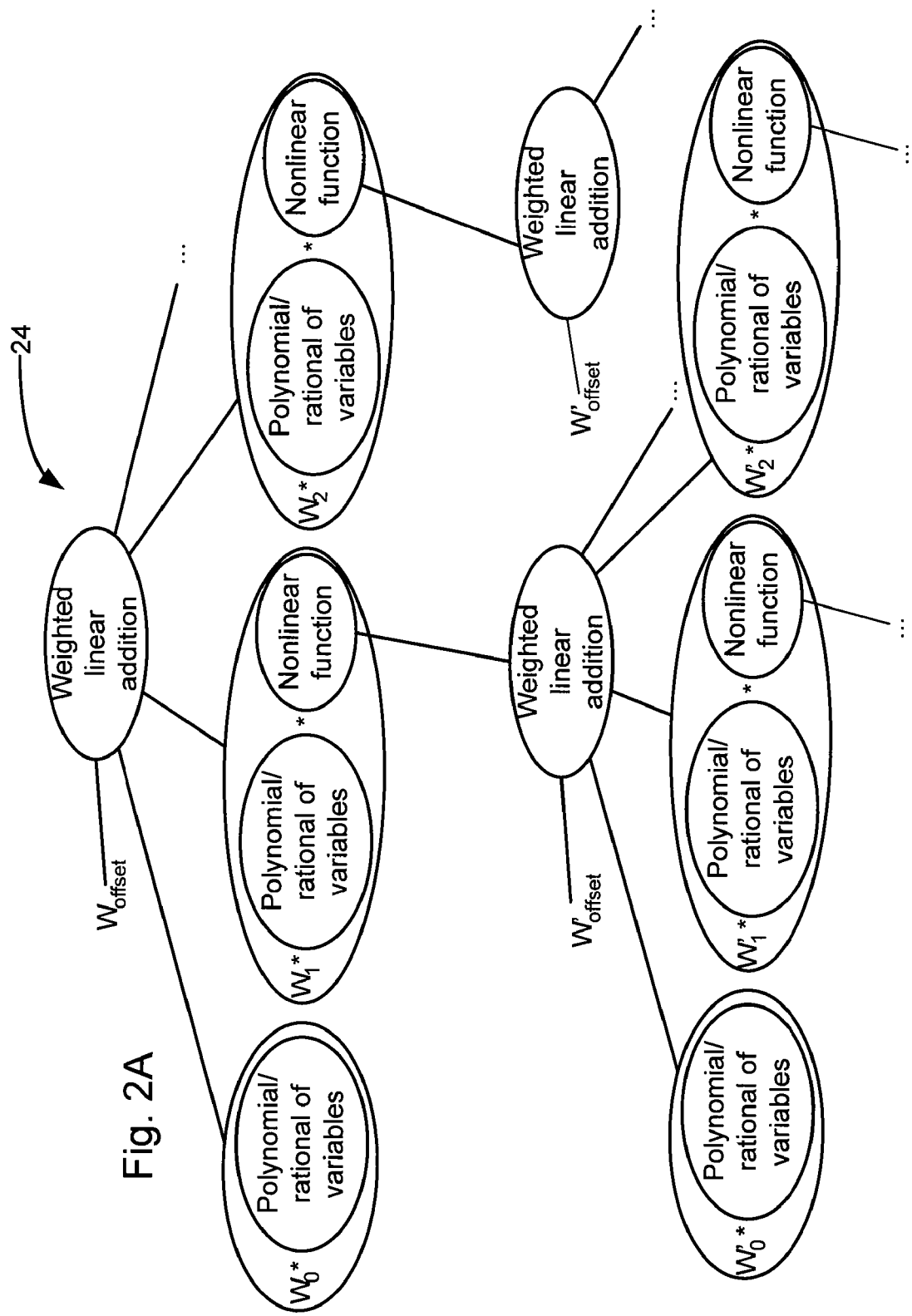
FIG. 2A shows a first example of a canonical form expression that can be used in the present invention.
Figure 2B:
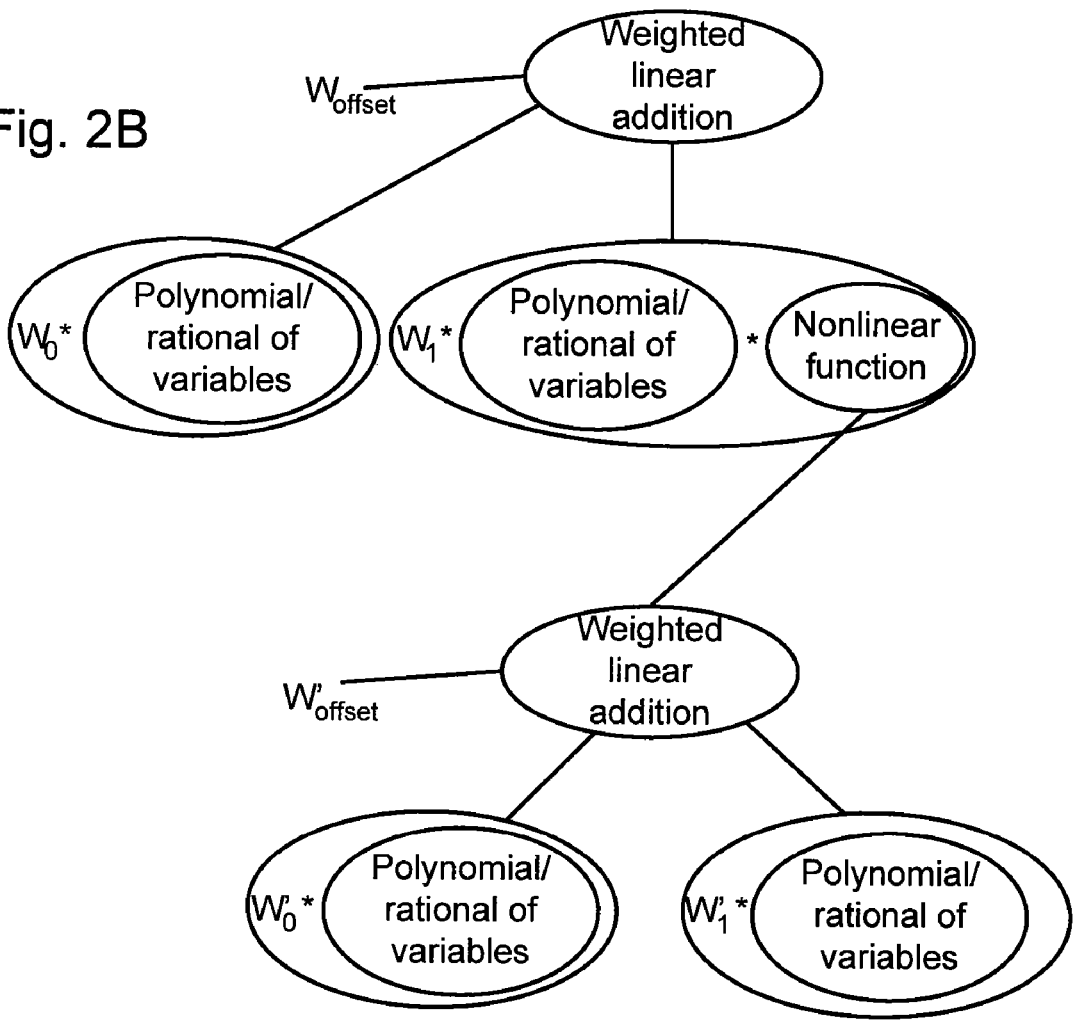
FIG. 2B shows an example of a canonical form function shown in FIG. 2A that can be used in the present invention.
Figure 2C:
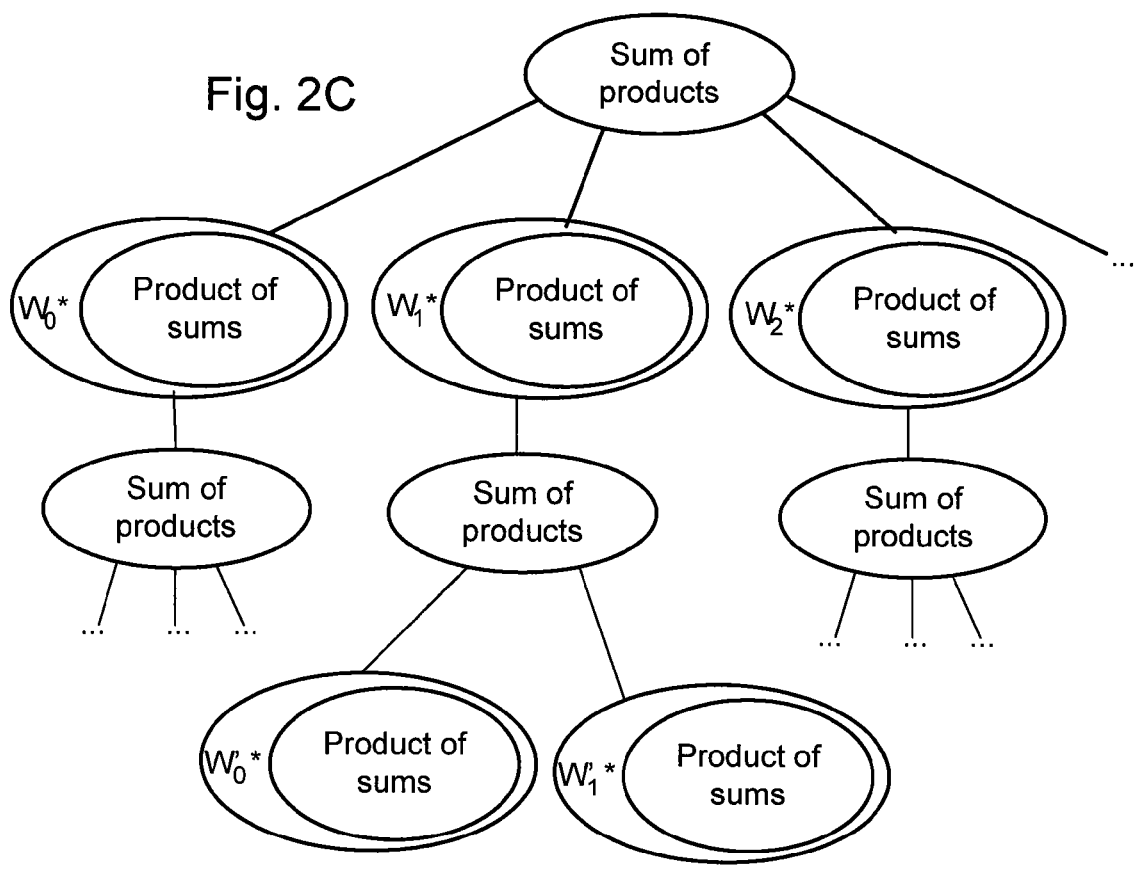
FIGS. 2C and 2D show other examples of canonical form function expressions that can be used in the present invention.
Figure 2D:
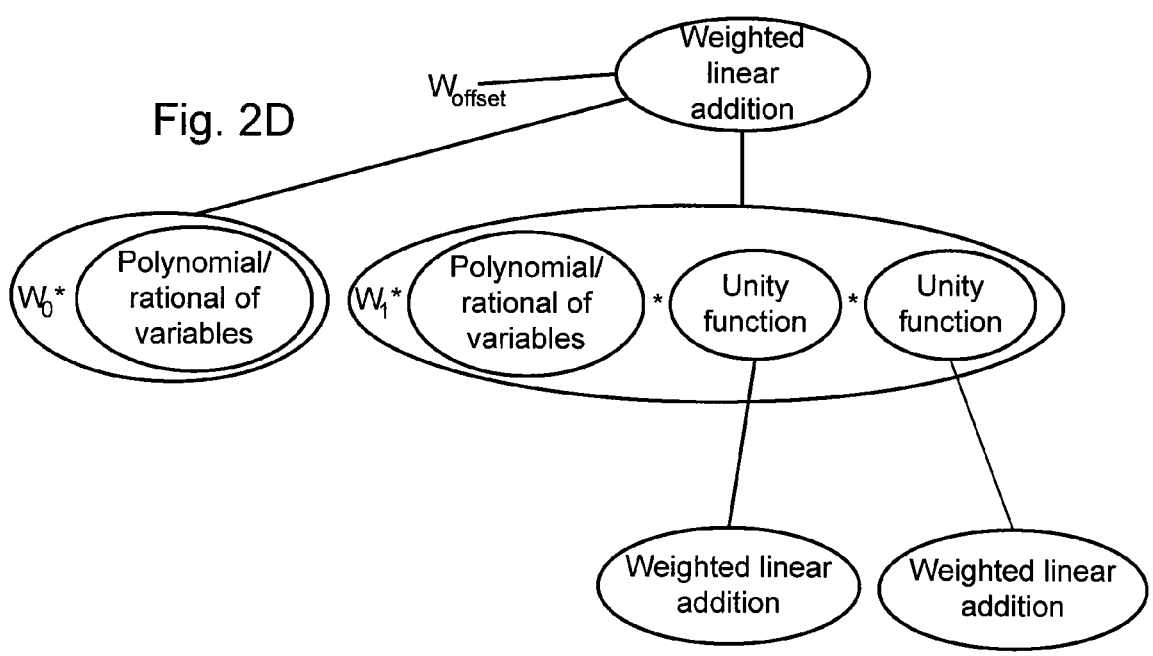

The GE module 12 is also in communication with a database 16 containing a set of rules defining allowable symbolic expressions generated and/or evolved by the GE module 12. The rules contained in the database 16 ensure that the symbolic expressions generated and/or evolved by the GE module 12 are in a pre-determined canonical form, i.e., is a form written in a standard, conventional, and logical way. FIG. 2A shows an example of such a canonical form function 24 in terms of a tree diagram. The generation and evolution of mathematical expressions having a canonical form such as function 24 is based on what is termed as canonical functional form expressions in evolution (CAFFEINE). As will be understood by a worker skilled in the art, the function 24 can be written as $$F(\vec{x}) = w_{offset} + \sum_{i=0}^{n} w_i \times f_i(\vec{x}) \times NL_i(\vec{x}),$$

where the variables of the system are represented as a vector $\vec{x}$, "n" is an integer, $w_{offset}$ is an offset value, $w_i$ are weights, $f_i(\vec{x})$ each includes at least one of a polynomial function and a rational function of the variables, and $NL_i(\vec{x})$ is a non-linear function of the variables, with $NL_0(\vec{x})=1$. FIG. 2B shows an example of function 24 in text form and in its corresponding tree form. Other examples of canonical forms include a sum of products (of sums of products), as shown in FIG. 2C, and a product of sums (of products of sums) (not shown). An example of CAFFEINE canonical form function with product terms including unity functions is shown in FIG. 2D.

CAFFEINE uses genetic programming (GP) as a starting point, but extends it in order to properly address template-free symbolic modeling. As is usually the case in GP, the functional form of results obtained from GP is completely unrestricted. While this may be advantageous compared to the restrictions of fixed-template regression it leads to expressions almost always too difficult to analyze. Also, an unrestricted form can cause undesirable biases in the search, such as tuning too many parameters which may even be redundant, or making it difficult to add and/or remove basis functions.

CAFFEINE attacks the issues of complexity and interpretability in two main ways. First, CAFFEINE can use a multi-objective approach that provides a tradeoff between error and complexity, and second, CAFFEINE uses a specially designed grammar to constrain the search to specific functional forms, such as, for example, the form shown in FIG. 4, without cutting out good solutions CAFFEINE and other suitable search algorithms can also use a single objective approach. For example, a single objective approach can be used for minimizing error and multi-objective approaches can be used for minimizing error and for minimizing complexity. Other multi-objective approaches can be used for minimizing error and for constraining complexity; or, for constraining error and for constraining complexity. CAFFEINE can use a multi-objective evolutionary algorithm namely NSGA-II as described in K. Deb, S. Agrawal, A. Pratap, T. A. Meyarivan, "A Fast Elitist Non-dominated Sorting Genetic Algorithm for Multiobjective Optimization: NSGA-II," Proc. PPSN VI, September 2000, pp. 849-858. NSGA-II returns a set of individuals that, collectively, trade off error and complexity (i.e. a non-dominated set). "Error" is normalized mean-squared error. "Complexity" is dependent on the number of basis functions, the number of nodes in each tree, and the exponents of "variable combos", VCs, which will be described later:

$$\text{complexity}(f) = \sum_{j=1}^{M_f} \left( w_b + nnodes(j) + \sum_{k=1}^{nvc(j)} vc\cos t(vc_{k,j}) \right) \quad (1)$$

where $w_b$ is a constant and $M_f$ is the maximum number of basis functions to give a minimum cost to each basis function, nnodes(j) is the number of tree nodes of basis function j, nvc(j) is number of VCs of basis function j, and $$vc\cos t = w_{vc} \sum_{dim=1}^{d} \text{abs}(vc(dim)).$$

"d" being the number of input dimensions.

This approach accomplishes simplification during generation by maintaining evolutionary pressure towards lower complexity. The user avoids an a priori decision on error or complexity because the algorithm generates a set of models, or symbolic expressions, that provide alternatives in terms of error and complexity. Other multi-objective algorithms such as, for example, NSGA, SPEA, SPEA II and PAES can also be used.

In GP, a means of constraining search is via a grammar, as described by A. Whigham in "Grammatically-based Genetic Programming," Proc. Workshop on GP: From Theory to Real-World Applications, J. R. Rosca, ed., 1995. Evolutionary operators must respect the derivation rules of the grammar, e.g., only sub-trees with the same root can be crossed over, and random generation of trees must follow the derivation rules. A basis function is the leaf nodes (terminal symbols) of the tree; internal nodes (nonterminal symbols) reflect the underlying structure; the tree root is the start symbol.

An example of a CAFFEINE grammar is as follows:

```
REPVC => 'VC' | REPVC '*' REPOP | REPOP
REPOP => REPOP '*' REPOP | 1OP '(' 'W' '+'
REPADD ')' | 2OP '(' 2ARGS ')' | ... 3OP, 4OP
etc
2ARGS => 'W' '+' REPADD ',' MAYBEW | MAYBEW
',' 'W' '+' REPADD
MAYBEW => 'W' | 'W' '+' REPADD
REPADD => 'W' '*' REPVC | REPADD '+' REPADD
2OP => 'DIVIDE' | 'POW' | 'MAX' | ...
1OP => 'INV' | 'LOG10' | ...
```

Terminal symbols are in quotes. Each non-terminal symbol has a set of derivation rules separated by '|'. The start symbol is REVPC; one tree is used for each basis function; basis functions are linearly weighted using least-squares learning. Basis function operators can include: creating a new individual by randomly choosing >0 basis function from each of 2 parents; deleting a random basis function; adding a randomly generated tree as a basis function; copying a subtree from one individual to make a new basis function for another.

The root is a product of variables and/or nonlinear functions, respectively REPVC and REPOP. Within each nonlinear function is a weighted sum of basis functions (REPADD). Each basis function can be, once again, a product of variables and/or nonlinear functions, and so on.

The grammar is context-free, with two exceptions for the sake of enhanced search. A real value is stored in the range [−2*B, +2*B] at each weight node. During interpretation of the tree the value is transformed into $$[-1e+B, -1e-B] \cup [0,0] \cup [1e-B, 1e+B]$$

where B is user-set, e.g., B=10. In this way parameters can take on very small or very large negative or positive values. Zero-mean Cauchy mutation (e.g., see X. Yao, Y. Liu and G. Lin, "Evolutionary Programming Made Faster," IEEE Trans. Evolutionary Computation 3(2), July 1999, pp. 82-102) is an operator on the real value.

Single-basis rational combinations of variables (VC) are related to vectors. With each VC a vector is stored, with integer value per design variable as the variable's exponent. An example vector is [1,0,−2,1], which means $$(x_1 * x_2)/(x_3)^2$$

For interpretability, real-valued and fractional-valued exponents are not allowed. VC operators include: one point crossover, and randomly adding or subtracting to an exponent value.

POW(a,b) is $a^b$. Via 2ARGS with MAYBEW, either the base or the exponent (but not both) can be constants. The designer can turn off any of the rules if they are considered unwanted or unneeded. For example, one could easily restrict the search to polynomials of variables or to rationals of variables, or remove potentially difficult-to-interpret functions such as sin and cos. The designer could change or extend the operators or inputs, e.g., to include $w_i$, $l_i$, and $w_i/l_i$, where $w_i$ and $l_i$ are the with and length of a transistor "i".

After the evolutionary run is complete, simplification after generation (SAG) can be performed on each of the final set of models in the tradeoff. SAG can be accomplished, for example, via the Predicted Residual Sums of Squares (PRESS) statistic (e.g., see L. Breiman, "Stacked Regression," Machine Learning, vol. 5, 1996, pp. 49-64) coupled with forward regression as shown in, e.g., X. Hong, P. M. Sharkey, K. Warwick, "A Robust Nonlinear Identification Algorithm Using PRESS Statistic and Forward Regression", IEEE Trans. Neural Networks 14(2), March 2003, pp. 454-458. PRESS approximates leave-one-out cross-validation on the linear parameters; forward regression prunes basis functions that harm predictive ability. This gives predictive robustness to the linear parameters. As will we understood by the skilled worker, any other suitable simplification approach can be used. One such alternative approach is the LASSO technique.

After that, the tradeoff models (symbolic expressions) are evaluated on test data, and filtered down to only models that satisfy pre-determined testing error and complexity criteria. Such a final step might not be possible with more deterministic approaches having more homogenous results, but the stochastic nature of CAFFEINE, causing more heterogeneous results, makes such filtering possible.

As seen in FIG. 2A, the exemplary canonical form function 24 has levels of expressions that alternate between linear expressions and nonlinear expressions, "gated" by nonlinear functions. The linear expressions are a sum of basis functions; each basis function has a weight ($w_0$, $w_1$, $w_2$, ...), and there is one overall offset ($w_{offset}$). A basis function is a combination of a polynomial/rational and/or one or more nonlinear operators. Inside each nonlinear function is another level of linear expressions.

Returning to FIG. 1, the GE module 12 is also in communication with a goal function output calculator and evaluator (GFOCE) 18. The GFOCE 18 receives data for a system data input 20. This data pertains to the characteristic of the system that the apparatus 100 is modeling. The data provided by the data input 20 can be simulated data, observed data or any other type of data regarding the system to be modelled. For example, in the case where the apparatus 100 is used to generate symbolic expressions describing a characteristic of an electrical system, the data provided by the data input 20 can be obtained from a Simulation Program with Integrated Circuit Emphasis (SPICE).

The GFOCE 18 is also in communication with a goal function input 22 that provides the GFOCE 18 with a goal function to be used in the calculation of the goal function value. The goal function is a function of the symbolic expressions generated and evolved by the GE module 12. The goal function can include an "error" componenent and a "complexity" component, as described above. The GFOCE 18 is programmed to calculate a goal function output and compare it to a pre-determined desired output. If the goal function output does not concord with the pre-determined desired output, the GFOCE 18 instructs the GE module 12 to evolve the symbolic expressions and recalculates the goal function output based on the evolved symbolic expressions. Upon the goal function value being within the desired range, the GFOCE 18 and the GE module 12 provide the goal function output and the corresponding evolved symbolic expressions to the output 24.

Figure 3:
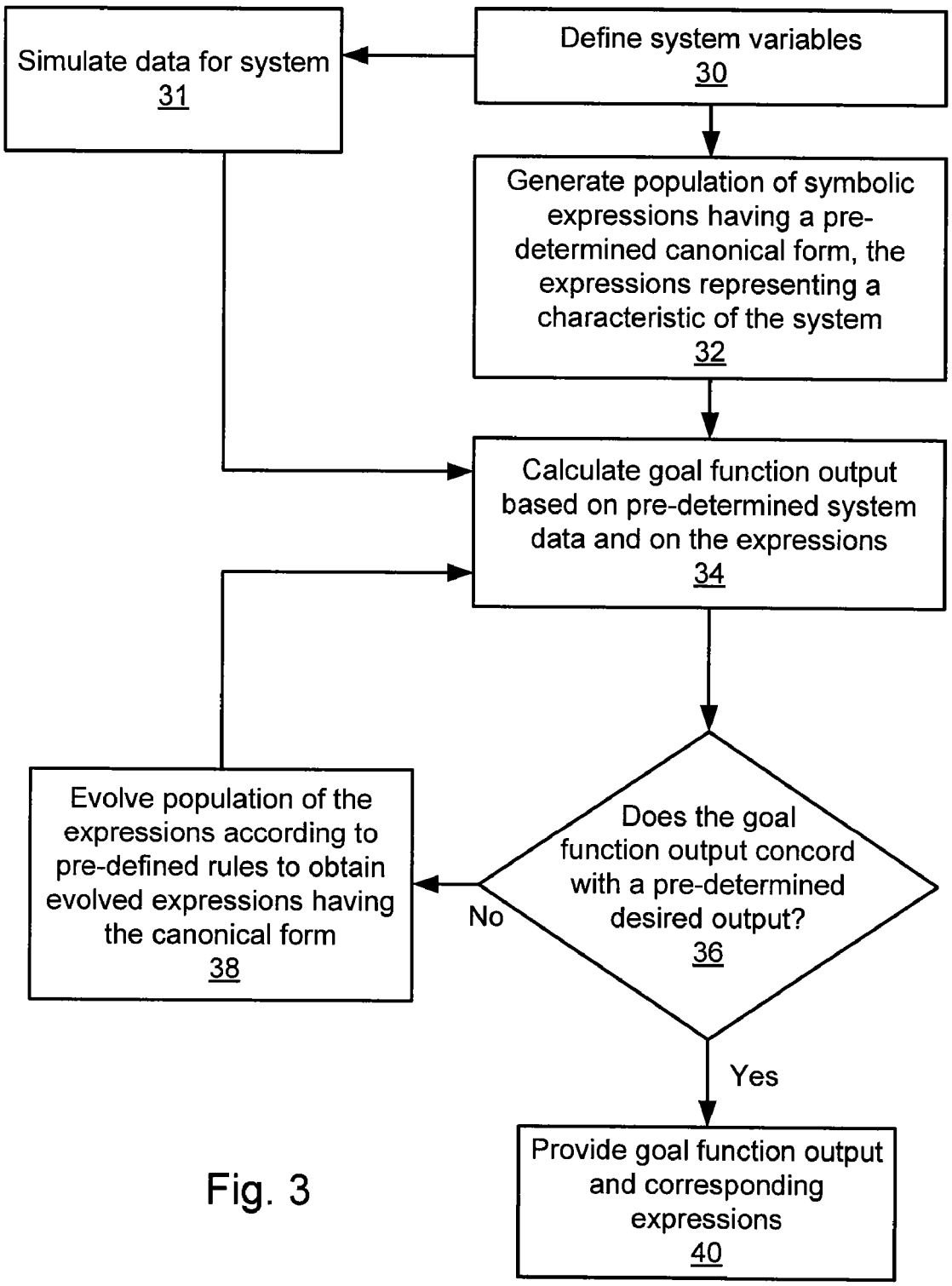
FIG. 3 shows a block diagram of an exemplary method of the present invention.

FIG. 3 shows an exemplary embodiment of the method of the present invention using the apparatus 100 of FIG. 1. As will be understood by the skilled worker, the method shown in FIG. 3 pertains to the genetic programming approach used by apparatus 100. Other search algorithms such as, for example, simulated annealing and Tabu searching will have their own related method flowchart. At step 30, the system variables are defined through any means suitable for the system at hand. Following this, data for a characteristic of the system in question is simulated at step 31. At step 32, a population of symbolic expressions describing the given characteristic is generated, the symbolic expressions having the system variables as variables and satisfying a pre-determined canonical form. At step 34, a goal function output of a pre-defined goal function is calculated based on the data simulated at step 31 and on the population of symbolic expressions generated at step 32. Following this, the goal function output is compared to a pre-determined desired output at step 36. If the goal function output concords with the desired output, the goal function output and the corresponding symbolic expressions produced at step 40. Otherwise, the population of symbolic expressions is evolved at step 38 and the goal function output calculated again at step 34.

As will be understood by a worker having ordinary skill in the art, the step 31 regarding the simulation of data can be replaced by a step of measuring data for the system in question.

Figure 4:
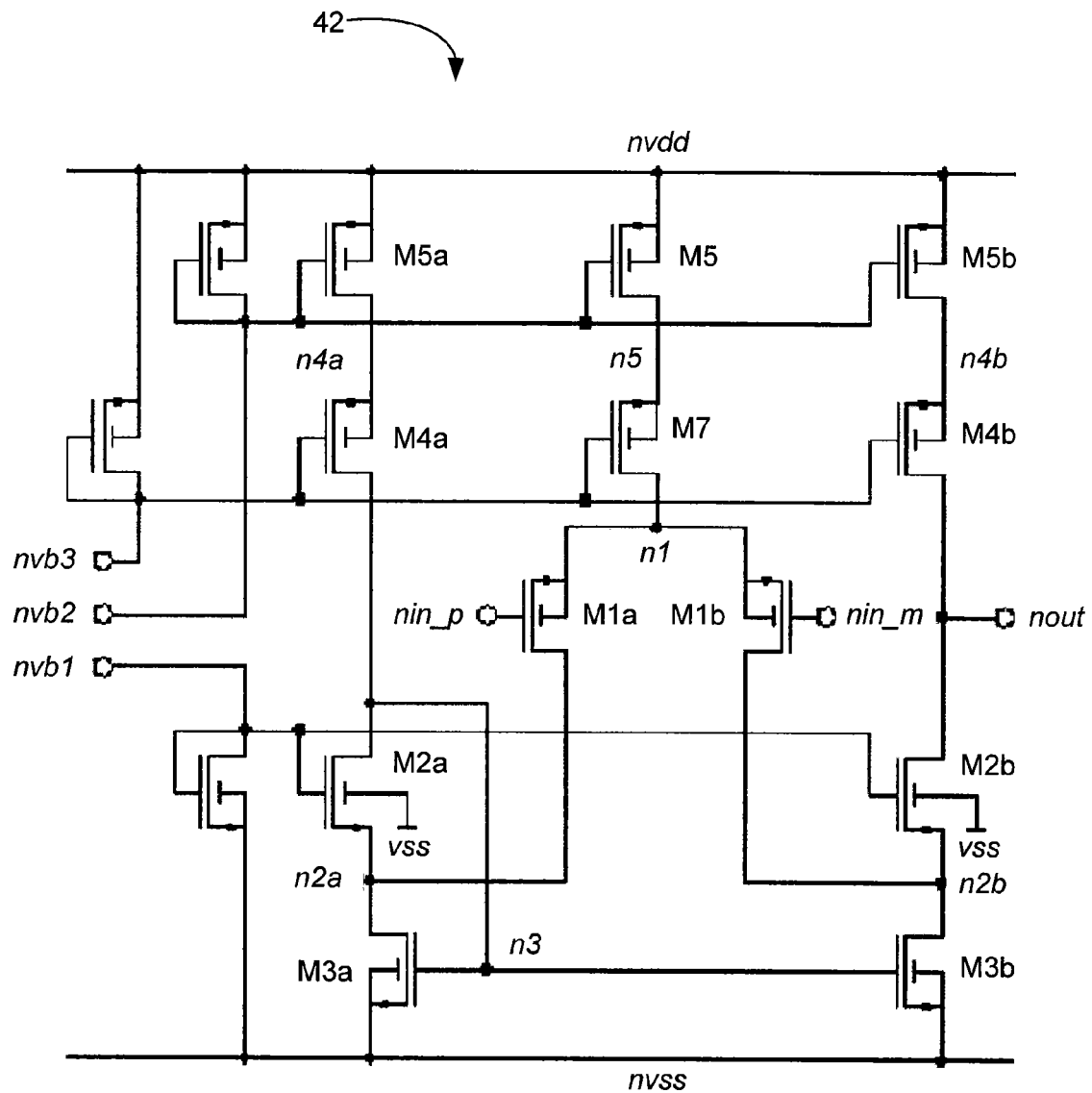
FIG. 4 is a schematic representation of an electrical circuit modeled with in accordance with the present invention.
Figure 5:
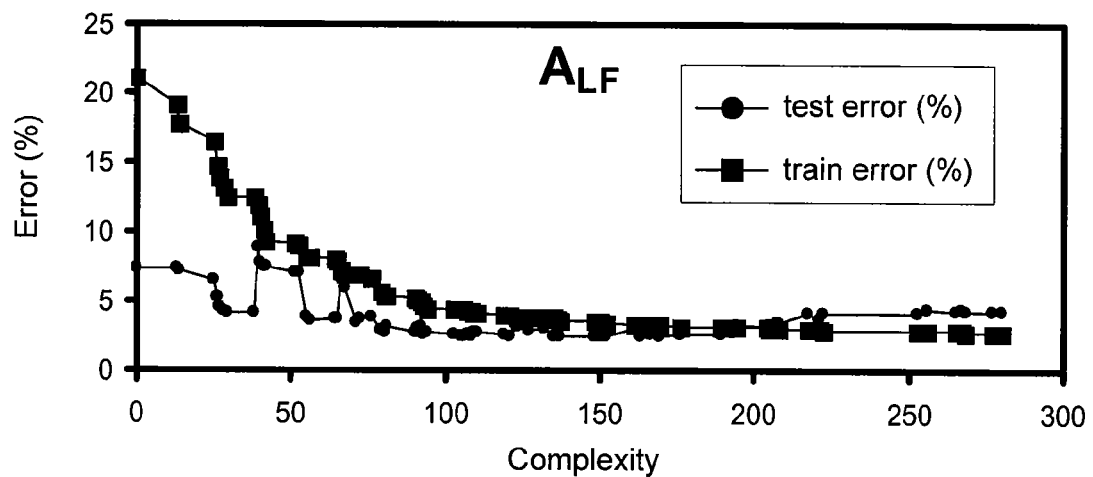
FIGS. 5 to 10 show Error vs. Complexity plots for various electrical characteristics of the circuit of FIG. 4.
Figure 6:
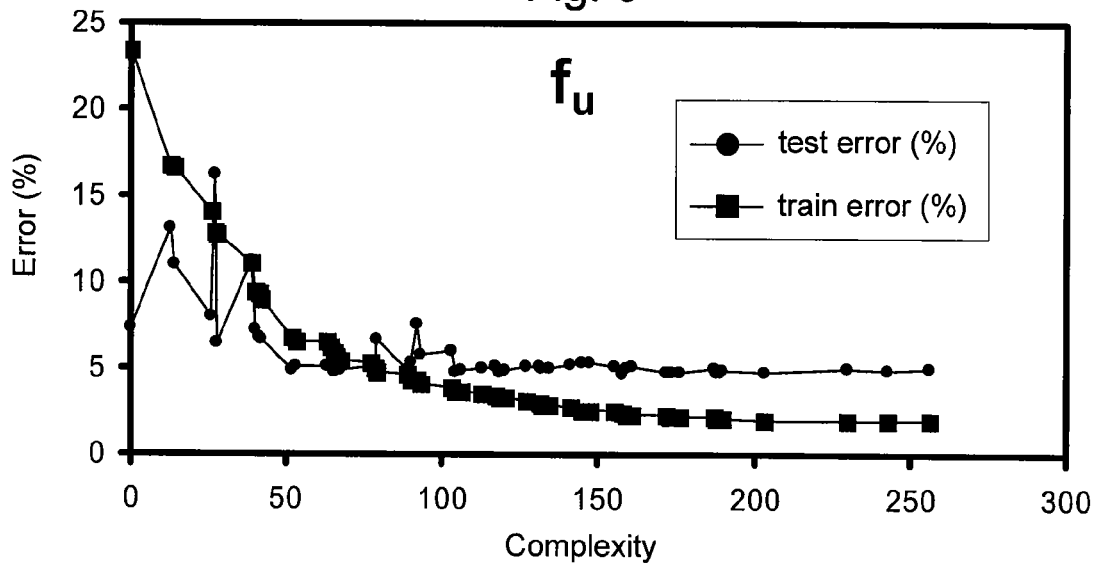
Figure 7:
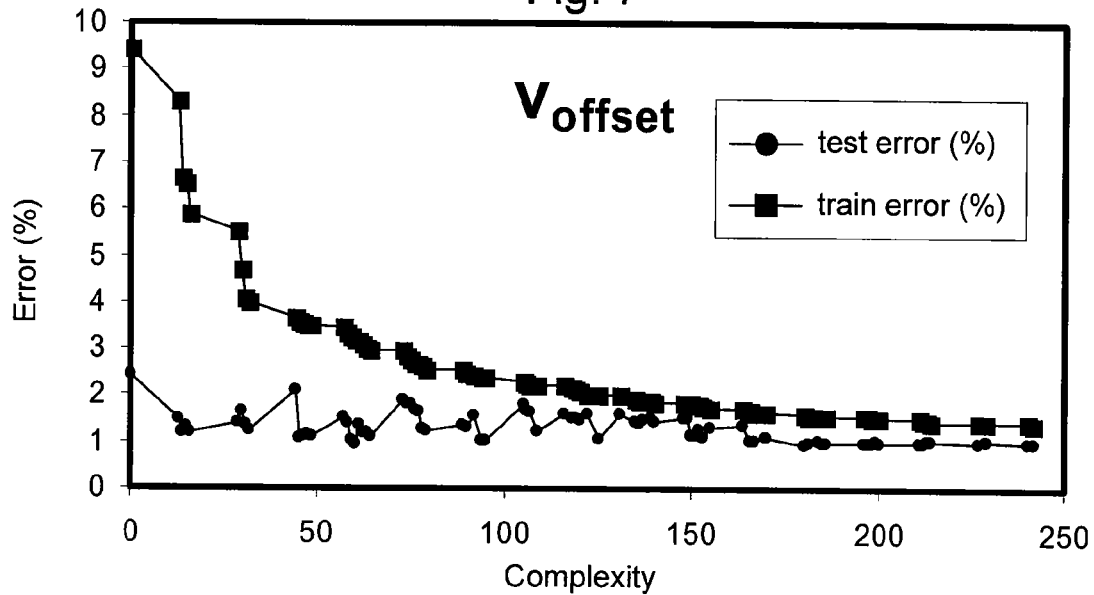
Figure 8:
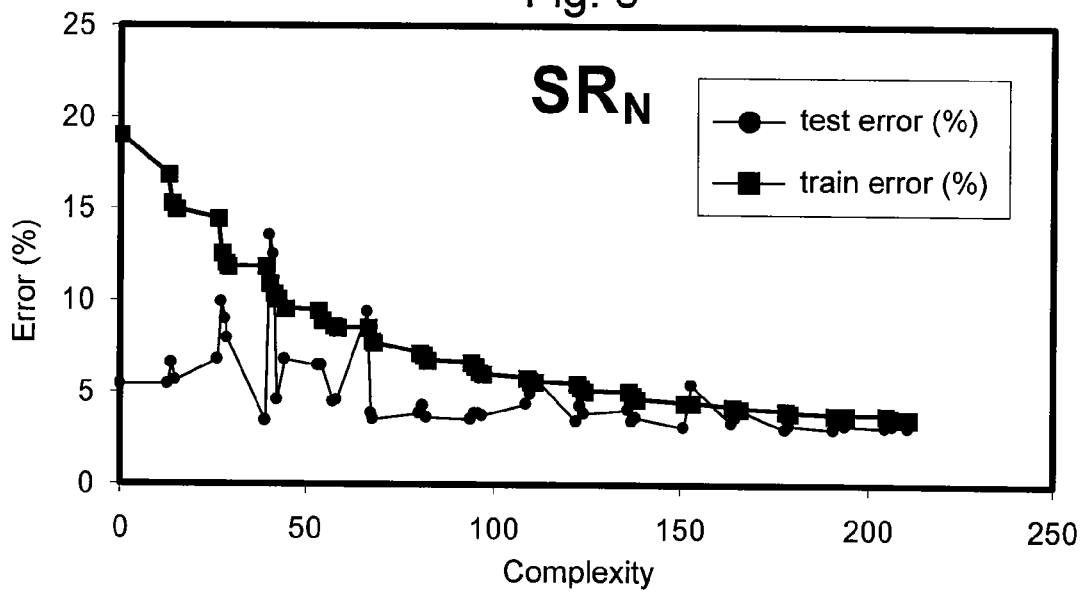
Figure 9:
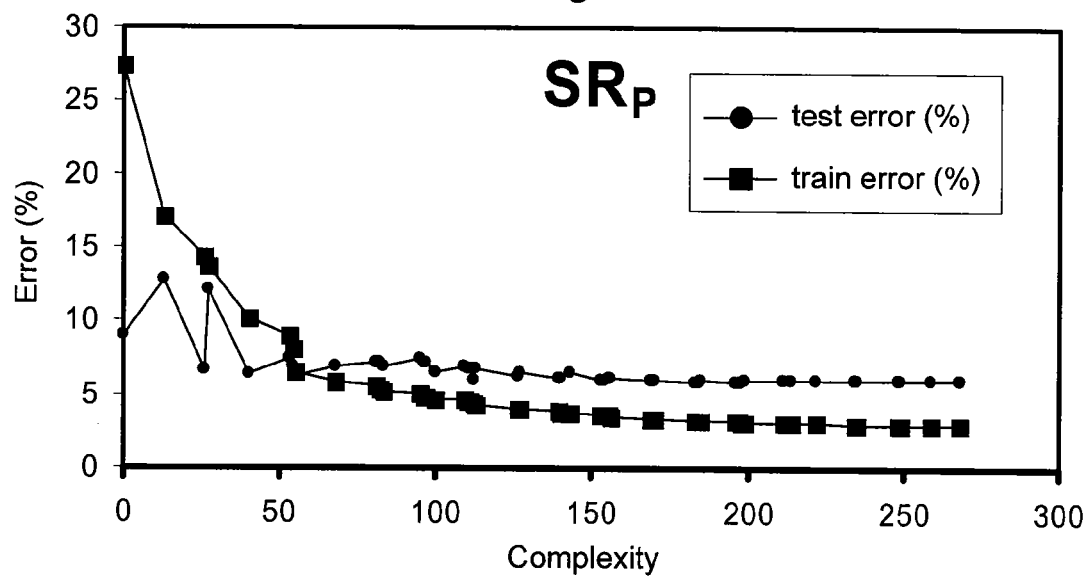
Figure 10:
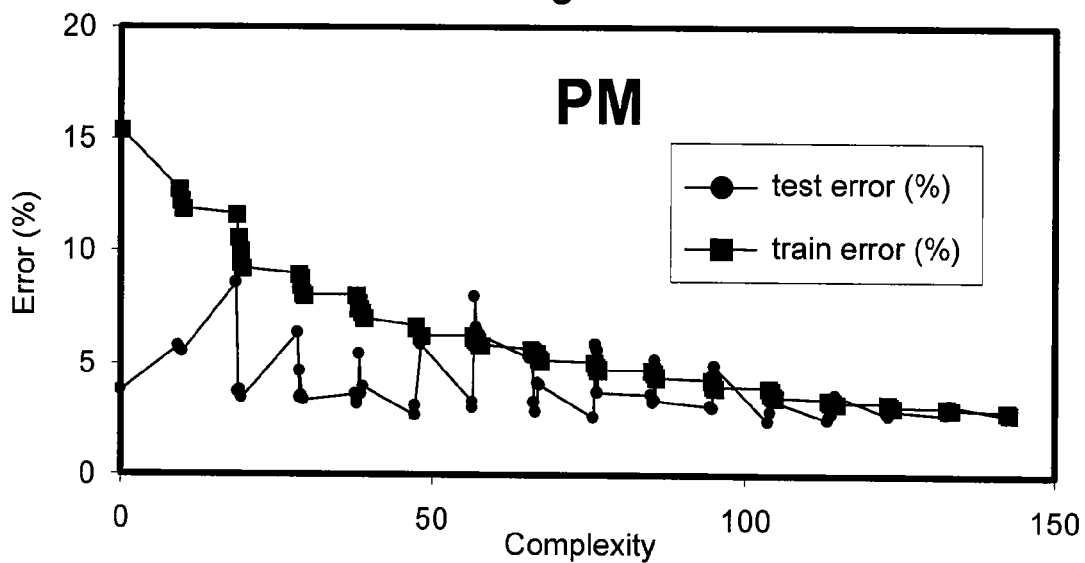

FIG. 4 shows an example of a non-linear electrical circuit 42 that can be modeled according to the present invention. The circuit 42 represents a high-speed, 0.7 μm, complementary metal-oxide-semiconductor (CMOS) operational transconductance amplifier (OTA). The supply voltage is 5V and the nominal threshold are 0.76V for NMOS-devices and −0.75V for PMOS devices. The circuit 42 has a drive load capacitance of 10 pF. Examples of performance characteristics of the circuit 42 include the low frequency gain ($A_{lf}$), the unity gain frequency ($f_u$), the phase margin (PM), the input-referred offset voltage ($V_{offset}$), the positive slew rate ($SR_p$) and the negative slew rate ($SR_n$).

The first requirement in obtaining symbolic expressions of the performance characteristics of the circuit 42 is to obtain data regarding the circuit 42. In the following example, the data in question is simulated using a SPICE program.

In this example, an operating-point driven formulation described in the article *An Efficient DC Root Solving Algorithm with Guaranteed Convergence for Analog Integrated CMOS Circuits*, by F. Leyn et al., Proceedings ICCAD 98 (November 1998), was used to determine the design variables of the circuit 42, and the ranges of operation of the design variables. Thirteen such design variables were chosen for the circuit 42. These voltage and current variables are expressed according to accepted terminology. They are: $V_{GS1}$, $V_{GS2}$, $V_{DS2}$, $V_{GS3}$, $V_{GS4}$, $V_{GS5}$, $V_{DS5}$, $V_{DS6}$, $I_{D1}$, $I_{D2}$, $I_{B1}$, $I_{B2}$, and $I_{B3}$, where G, S and D respectively relate to the gate, source and drain of a given device. $V_{GS1}$, $V_{GS3}$, $V_{GS4}$, and $V_{GS5}$ can range from −0.75V to −4V; $V_{GS2}$ can range from 0.75V to 4V; $V_{DS5}$ and $V_{DS6}$ can range from −0.1 to −4V; $I_{D1}$ can range from −10 μA to −10 mA; $I_{D2}$ can range from 10 μA to 10 mA; and $I_{B1}$, $I_{B2}$, and $I_{B3}$ can range from 1 μA to 100 μA.

In simulating data for the circuit 42, full orthogonal-hypercube Design-Of-Experiments (DOE) sampling of design points was used with scaled step sizes of 0.1. This yielded 243 samples with three simulations each, some of which did not converge. Simulation time for one sample was about 1 s (about 4 minutes for all samples). This is fully dependent on the circuit, analyses, and experimental design being used. These samples, otherwise unfiltered, were used as training data inputs. As will be discussed further below, testing data inputs were also sampled with full orthogonal-hypercube DOE and 243 samples, but with scaled step sizes of 0.03. Thus, in this experiment a localized model was created; however, one could just as readily model a broader design space.

The simulation data generated as described above was used to generate interpretable symbolic expressions having the form of equation 24 shown in FIG. 2A, the expressions relating to the circuit low frequency gain ($A_{lf}$), unit gain frequency ($f_u$), phase margin (PM), voltage offset ($V_{offset}$), positive slew rate ($SR_p$) and negative slew rate ($SR_n$).

The run settings were: maximum number of basis functions=15, population size 200, 5000 generations, maximum tree depth 8, and parameter range [−1e+10,−1e−10]∪[0,0]∪[1e−10,1e+10]. All operators had equal probability, except parameter mutation was 5× more likely. Complexity measure settings were $w_b=10$, $w_{vc}=0.25$. Just one run was done for each performance goal, for 6 runs total. Each run took about 12 hours on a 3 GHz Pentium IV Linux workstation. After each run, SAG was done, taking about 10 min.

Normalized mean-squared error on the training data and separate testing data were used. These are standard measurements in regression literature. Testing error is ultimately the more important measure. These measures are identical to two of the three posynomial "quality of fit" measures of W. Daems, G. Gielen, W. Sansen, "Simulation-based generation of posynomial performance models for the sizing of analog integrated circuits," *IEEE Trans. CAD* 22(5), May 2003, pp. 517-534 where $q_{wc}$ is training error, and $q_{tc}$ is testing error. ($q_{wc}$ and $q_{tc}$ are identical as long as the constant 'c' in the denominator is zero, which is what Daems et al. did.) We ignore $q_{oc}$, which measured the error at just one training point.

FIGS. 5, 6, 7, 8, 9 and 10 show the results for $A_{lf}$, $f_u$, $V_{offset}$, $SR_n$, $SR_p$, and PM respectively. As seen in FIGS. 5-10, CAFFEINE generates a tradeoff of about 50 different models. As expected, models with zero complexity, i.e., models with just a constant, have the highest training error, and models with the highest complexity have the lowest training error.

Although not shown in FIGS. 5-10, the number of basis functions generally increases with the complexity. This is not always the case, however, as larger trees increase complexity too. Plateaus and dips in the number of basis functions data show that this does indeed occur. In every case shown in FIGS. 5-10, CAFFEINE used the maximum allowed number of basis functions (15) to achieve the lowest error. Error could have been reduced further, but models with 15 basis function models are already at the edge of interpretability.

The testing error is also shown in FIGS. 5-10. Unlike training error, it is not monotonically decreasing as complexity rises. This means that some less complex models are more predictive than more complex ones. However, if the number of models is pruned down to the ones that give a tradeoff between testing error and complexity, approximately 5-models are left for each circuit characteristic. These 5-10 models of the most interest. As is known in the art, tradeoffs in general are defined by the notions of Pareto dominance. A goal values point is on the tradeoff if it is nondominated. It is nondominated if no other point dominates it. A point 'a' dominates another point 'b' if all values of 'a' are at least as good as 'b', and at least one value is better.

It is notable that the testing error is lower than the training error in almost all cases. This sounds promising, but such behavior is rare in the regression literature; however, there is a valid reason for this. Recall that the training data is from extreme points of the sampling hypercube (scaled dx=0.10), and the testing data is internal to the hypercube (dx=0.03). This testing data tests interpolation ability. Thus, models that really are predictive should be able to interpolate well, even at the cost of a perfect fit to the extreme points. In any case, to validly have testing error lower than training error demonstrates the strength of the CAFFEINE approach.

Let us now examine the actual symbolic models generated by CAFFEINE. Table I shows the functions that provide less than 10% error in both training and testing data ($f_u$ has been converted to its true form by putting the generated function to the power of 10). We see that each form has up to 4 basis functions, not including the constant. For $V_{offset}$, a constant was sufficient to keep the error within 10%. We see that a rational functional form was favored heavily; at these target errors only one nonlinear function, ln( ), appears (for $A_{LF}$). That expression effectively says that the order of magnitude of some input variables is useful.

TABLE I

CAFFEINE-generated symbolic models which have less than 10% training and testing error

| Perf. | Target (%) $q_{wc}$ | $q_{tc}$ | Expression |
|---|---|---|---|
| $A_{LF}$ | 10 | 10 | −10.3 + 7.08e−5/id1 + 1.87 * ln(−1.95e+9 + 1.00e+10/(vsg1*vsg3) + 1.42e+9 *(vds2*vsd5)/(vsg1*vgs2*vsg5*id2)) |

TABLE I-continued

CAFFEINE-generated symbolic models which have
less than 10% training and testing error

| Perf. | Target (%) $q_{wc}$ | $q_{tc}$ | Expression |
|---|---|---|---|
| $f_u$ | 10 | 10 | $10\hat{\ }(5.68 - 0.03 * \text{vsg1/vds2} - 55.43 * \text{id1} + 5.63\text{e-}6/\text{id1})$ |
| PM | 10 | 10 | $90.5 + 190.6 * \text{id1/vsg1} + 22.2 * \text{id2/vds2}$ |
| $V_{offset}$ | 10 | 10 | $-2.00\text{e-}3$ |
| $SR_p$ | 10 | 10 | $2.36\text{e+}7 + 1.95\text{e+}4 * \text{id2/id1} - 104.69/\text{id2} + 2.15\text{e+}9 * \text{id2} + 4.63\text{e+}8 * \text{id1}$ |
| $SR_n$ | 10 | 10 | $-5.72\text{e+}7 - 2.50\text{e+}11 * (\text{id1}*\text{id2})/\text{vgs2} + 5.53\text{e+}6 * \text{vds2/vgs2} + 109.72/\text{id1}$ |

One can examine the equations in more detail to gain an understanding of how design variables in the topology affect performance. For example, $A_{LF}$ is inversely proportional to $i_{d1}$, the current at the OTA's differential pair. Or, $SR_p$ is solely dependent on $i_{d1}$ and $i_{d2}$ and the ratio $i_{d1}/i_{d2}$. Or, within the design region sampled, the nonlinear coupling among the design variables is quite weak, typically only as ratios for variables of the same transistor. Or that each expression only contains a (sometimes small) subset of design variables. Or, that transistor pairs M1 and M2 are the only devices affecting five of the six performances (within 10%). By only putting the relevant variables into a model, the approach demonstrates the potential to provide expressions for circuits with significantly more variables.

One may improve understanding in another fashion by examining expressions of varying complexity for a single performance characteristic. Low-complexity models will show the macro-effects; alterations to get improved error point show how the model is refined to handle second-order effects. Table II shows models generated for PM in decreasing training and testing error. A constant of 90.2, while giving 15% training error, had only 4% test error. For better prediction, CAFFEINE injected two more basis functions; one basis being the current into the differential pair $i_{d1}$, the other basis, $i_{d2}/v_{ds2}$, the ratio of current to drain-source voltage at M2. The next model turns the input current term into a ratio $i_{d1}/v_{sg1}$. Interestingly, and reassuringly, almost all ratios use the same transistor in the numerator and denominator. Such analyses achieve the aim of this tool: to improve understanding of the topology.

TABLE II

CAFFEINE-generated models of PM, in order of
decreasing error and increasing complexity

| Test error (%) | Train error (%) | PM Expression |
|---|---|---|
| 3.98 | 15.4 | 90.2 |
| 3.71 | 10.6 | $90.5 + 186.6 * \text{id1} + 22.1 * \text{id2/vds2}$ |
| 3.68 | 10.0 | $90.5 + 190.6 * \text{id1/vsg1} + 22.2 * \text{id2/vds2}$ |
| 3.39 | 8.8 | $90.1 + 156.85 * \text{id1/vsg1} - 2.06\text{e-}03 * \text{id2/id1} + 0.04 * \text{vgs2/vds2}$ |
| 3.31 | 8.0 | $91.1 - 2.05\text{e-}3 * \text{id2/id1} + 145.8 * \text{id1} + 0.04 * \text{vgs2/vds2} - 1.14/\text{vsg1}$ |
| 3.20 | 7.7 | $90.7 - 2.13\text{e-}3 * \text{id2/id1} + 144.2 * \text{id1} + 0.04 * \text{vgs2/vds2} - 1.00/(\text{vsg1}*\text{vsg3})$ |
| 2.65 | 6.7 | $90.8 - 2.08\text{e-}3 * \text{id2/id1} + 136.2 * \text{id1} + 0.04 * \text{vgs2/vds2} - 1.14/\text{vsg1} + 0.04 * \text{vsg3/vsd5}$ |
| 2.41 | 3.9 | $91.1 - 5.91\text{e-}4 * (\text{vsg1}*\text{id2})/\text{id1} + 119.79 * \text{id1} + 0.03 * \text{vgs2/vds2} - 0.78/\text{vsg1} + 0.03 * \text{vsg1/vsd5} - 2.72\text{e-}7/(\text{vds2}*\text{vsd5}*\text{id1}) + 7.11 * (\text{vgs2}*\text{vsg4}*\text{id2}) - 0.37/\text{vsg5} - 0.58/\text{vsg3} - 3.75\text{e-}6/\text{id1} - 5.52\text{e-}6/\text{id1}$ |

Figure 11:
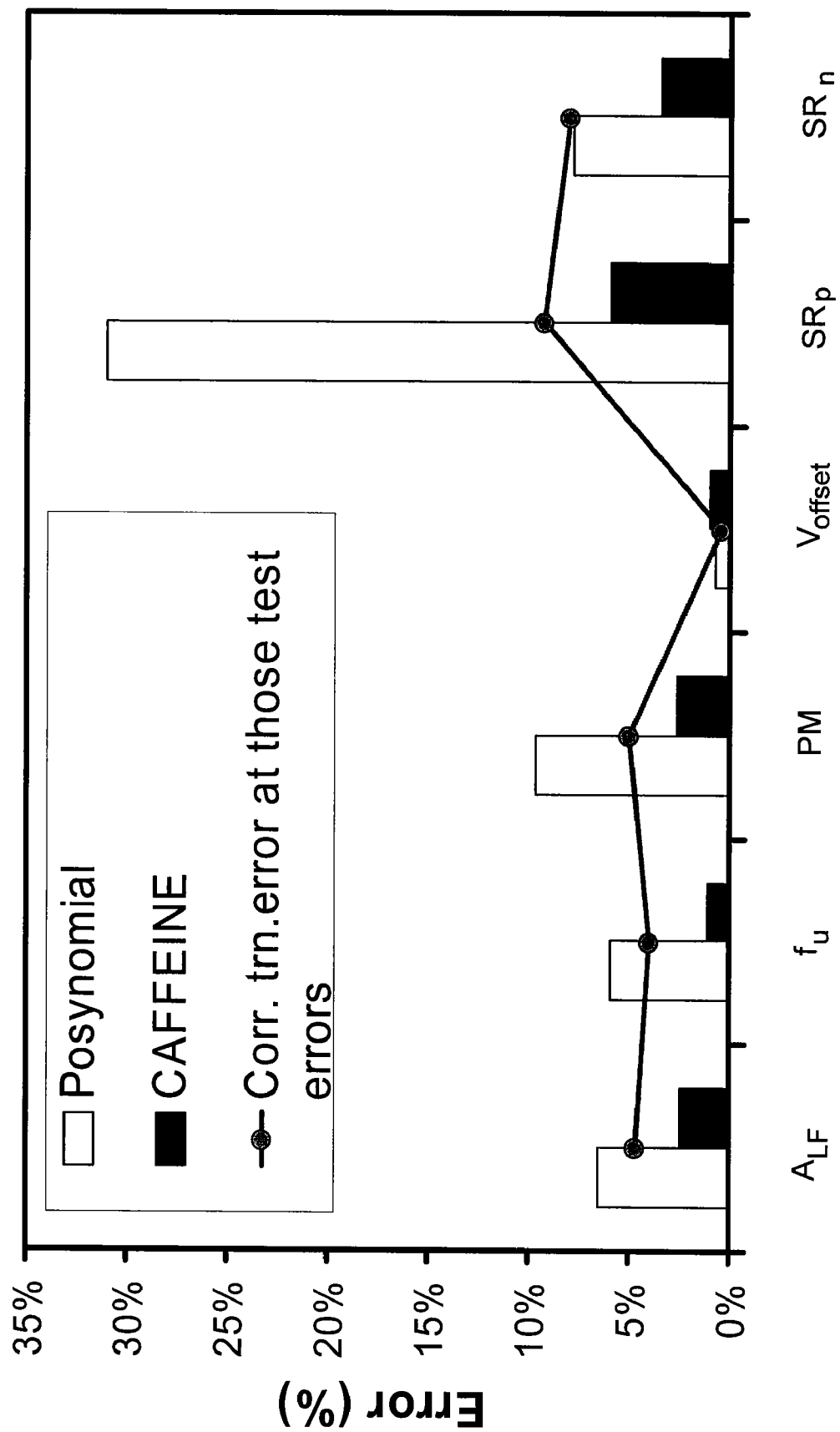
FIG. 11 shows a comparison graph of the method of the present invention and a posynomial method.

CAFFEINE was compared to the posynomial approach using the numbers in W. Daems et al., "An efficient optimization-based technique to generate posynomial performance models for analog integrated circuits", Proc. DAC 02, June 2002. The test and training errors are first compared. To pick a model from a CAFFEINE-generated tradeoff for comparison, we fixed the training error to what the posynomial achieved, then compared testing errors. Results are shown in FIG. 11. In one case, for $V_{offset}$, CAFFEINE did not meet the posynomial training error (0.4%), so it probably could have used more basis functions. Therefore, an expression which very nearly matched the posynomial approach's testing error of 0.8% was chosen. FIG. 11 clearly shows that CAFFEINE has lower testing error than training error, which provides great confidence in the models. In contrast, in all cases but $V_{offset}$, the posynomials had higher testing error than training error, even on this interpolative data set. CAFFEINE models' testing errors were 2× to 5× lower than the posynomial models. The exception is $V_{offset}$, where the posynomial achieves 0.8% testing error compared to 0.95% for CAFFEINE. With posynomials having weak prediction ability even in interpolation, in comparison to more compact models, one might question the trustworthiness of constraining models of analog circuits to posynomials.

Thus, the present invention provides a tool which for the first time can generate interpretable, template-free symbolic models of nonlinear analog circuit performance characteristics. CAFFEINE is built upon genetic programming, but its key is a grammar that restricts symbolic models to a canonical functional form. CAFFEINE generates a set of models that collectively trade off between error and complexity. Visual inspection of the models demonstrates that the models are interpretable. These models were also shown to be significantly better than posynomials in predicting unseen data.

The above modeling approach can be improved as described below, the improvement generally referred to as double-strength CAFFEINE.

Unlike other approaches, CAFFEINE, as described above, and as described in, e.g, T. McConaghy, T. Eeckelaert, G. Gielen, "CAFFEINE: Template-Free Symbolic Model Generation of Analog Circuits via Canonical Form Functions and Genetic Programming", Proc. DATE 2005, March 2005, generates symbolic models with open-ended functional forms, i.e. without a priori supplied templates. CAFFEINE's strategy is to build Canonical Functional Form Expressions in Evolution so that functions are interpretable.

CAFFEINE's speed can be improved. In T. McConaghy, G. Gielen, "Analysis of Simulation-Driven Numerical Performance Modeling Techniques for Application to Analog Circuit Optimization," Proc. ISCAS 05, May 2005, ten modeling techniques were compared on six problems, in the context of circuit optimization. While CAFFEINE had the best prediction ability, it needed to be at least 3× faster to have model building time below 5 minutes. Speed would also help behavioral modeling such as described in T. McConaghy, G. Gielen, "IBMG: Interpretable Behavioral Model Generator for Nonlinear Analog Circuits via Canonical Form Functions and Genetic Programming," Proc. ISCAS 05, May 2005, which is incorporated in its entirety herein by reference.

The following shows how to speed up CAFFEINE using two techniques novel to analog CAD and to canonical-form function building: "smooth operators" and "introns". The improvements include: reconciling so-called "smooth, uniform crossover" and "smooth mutation" with canonical form functions; designing non-expressed subfunctions, or "introns", for canonical form functions; demonstrating faster creation of template-free interpretable symbolic models, thus creating new opportunities for applying CAFFEINE, most notably in automated circuit sizing.

The increase in speed is measured as the reduction in number of candidate functions (individuals) to solve test problems. The multi-objective nature of CAFFEINE adds a wrinkle: one can measure performance of multi-objective algorithms (e.g., see E. Zitzler, K. Deb, and L. Thiele, "Comparison of Multiobjective Evolutionary Algorithms: Empirical Results," *Evolutionary Computation* 8(2), Summer 2000, pp. 173-195), but such measures either lose information making multi-objective measures scalar, or provide just qualitative assessment. A simpler route appropriate to the problem can be taken: have an upper bound of complexity, minimize the training normalized mean-squared error (nmse) with a single-objective algorithm, and stop when target nmse is hit. This strategy is fair as long as the speedups are independent of the number of objectives.

The following describes why an algorithm designer would aim for operators that are "smooth", that are "uniform," and what those terms mean in the context of search.

When a search operator is designed, the structure of the space that the search algorithm will be traversing is actually shaped. If the operator design are good, then the space will appear relatively smooth to the search algorithm, have less local optima, and thus be easier to navigate. Conversely, if the operator design is bad, then the space will have jagged peaks, crevasses, and a high number of local optima. Algorithms that search in a space of possible structures (such as GP) usually tend to belong in this latter category—but only because the importance of operator design is underestimated.

"Smooth operators" in GP are an explicit attempt to make structural change better behaved, to "melt" the jagged peaks into smooth hills. Smooth operators cause small expected change in fitness when an individual is changed slightly. This in turn gives a higher expected probability of a successful search step. A key insight to designing such smooth operators is via "behavioral bridge" (e.g., see T. McConaghy, "Smooth Operators in Optimization of Circuit Structures," U.S. Pat. No. 6,859,914), which can be summarized as: design an operator such that a small change in a design space usually causes a small change in behavior space, which usually causes a small change in fitness space. Below, it is shown how to create smooth operators for the search of structures of functions.

Even if one has smooth operators, the space might be structured such that two near-identical designs are at opposite ends of the space, such that reaching one from the other would take an unreasonable number of mutations. What one needs in search is a way to quickly "tunnel" between two design regions that are similar (though of course not "tunnel" in a way that is catastrophic to the design).

A good tool to consider "similar design regions" is the notion of "building blocks" (e.g., see D. E. Goldberg. Genetic Algorithms in Search, Optimization and Machine Learning. Addison-Wesley, 1989.). In GP, a building block is a subtree; not all nodes of that subtree need to have been chosen yet (e.g., see W. B. Langdon, R. Poli. Foundations of Genetic Programming. Springer, 2002). Similar points in the GP search space have a large number of similar subtrees. From this perspective, GP's function is to process building blocks, via its sub-processes of selection, reproduction, crossover, and mutation. A key aim is to ensure that building blocks continue to "mix well," which is equivalent to ensuring a good set of tunnels between similar regions in design space. In GP, it has been shown that "uniform crossover" accomplishes such mixing (e.g, see W. B. Langdon, R. Poli. Foundations of Genetic Programming. Springer, 2002). Recall that "crossover" swaps sub-portions of the design of one parent with the sub-portions of the second parent, to create two children. In uniform crossover, each node in each location of the child has equal probability of coming from either parent. Compared to other crossover styles, uniform crossover has the most possibility for variety in new designs.

Uniform crossover on trees is hard to implement, as one needs to align operators, handle different depths, and handle functions of different arity. R. Poli, J. Page, W. B. Langdon, "Smooth Uniform Crossover, Sub-Machine Code GP and Demes," *Proc. Genetic and Ev. Comp. Conf. (GECCO)*, vol 2, July 1999, pp. 1162-1169, had heuristics to handle these issues, which were complex but worked for its problem domain; their payoff was a decent speedup. It is also challenging to find a way to add smoothness to uniform crossover. This is addressed below.

"Smooth" and "uniform" operators were just discussed together with their usefulness. Introns are discussed next after which a proposed algorithm will be described.

Introns are subtrees that are not "expressed", i.e. when such subtrees change the fitness stays the same. They are the equivalent of "junk DNA" in biology. They are usually unintentional and therefore hard to control, but it has been shown that they can be explicitly designed, and that doing so improves search speed and reliability (e.g., see V. Vassilev, J. Miller, "The Advantages of Landscape Neutrality in Digital Circuit Evolution,"*ICES,* 2000, pp. 252-263).

The explanation from a fitness landscape perspective is that such "neutral" changes connect regions of search space that would otherwise be poorly connected, therefore reducing the probability of getting caught in local optima (e.g., see W. Banzhaf, "Genotype-Phenotype Mapping and Neutral Variation—A Case Study in Genetic Programming," In Y. Davidor et al, eds., *Proc. PPSN III,* 1994, pp. 322-332). So whereas in the last section we showed how an operator can be designed to tunnel (crossover), introns actually leverage representation to tunnel.

Below is presented how to embed smooth operators and introns into CAFFEINE, yet have interpretable functions via a canonical form. The whole same algorithmic flow as the original CAFFEINE is retained albeit with changed operators and representation.

The trickiest part is in designing the crossover operator, most notably making it both uniform and smooth. The key to solve this is to notice that a canonical form function already imposes a structure—rather than trying to work around it, it can be exploited. It will be shown how to abandon a "true" tree representation, and instead use the canonical form to wedge the tree into a bit string.

Figure 12:
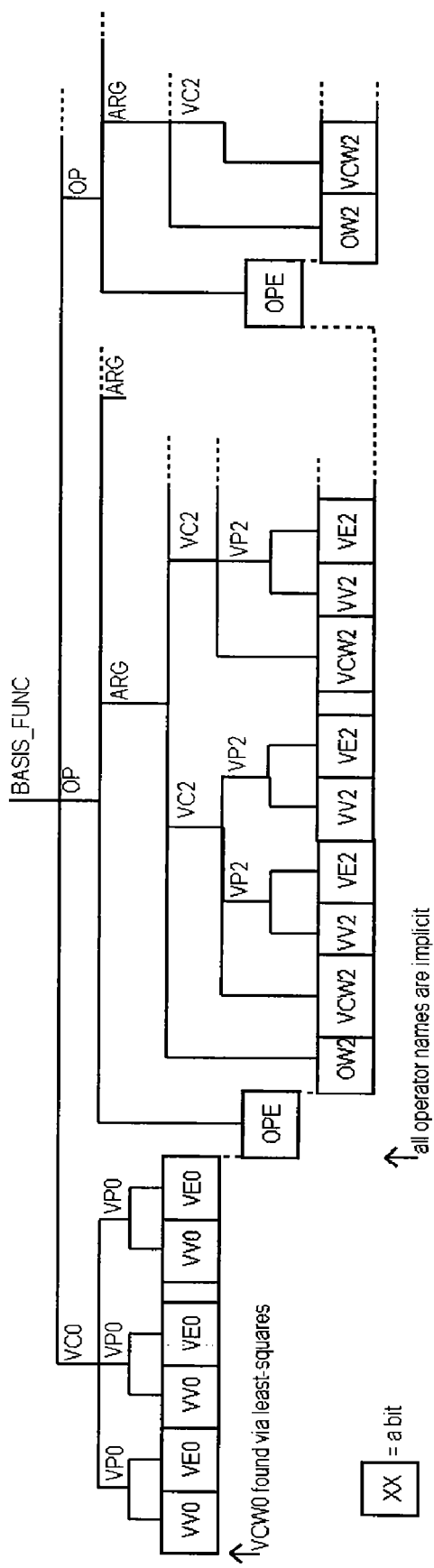
FIG. 12 shows a search space representation of a basis function of one individual in Double-Strength CAFFEINE.
Figure 13:
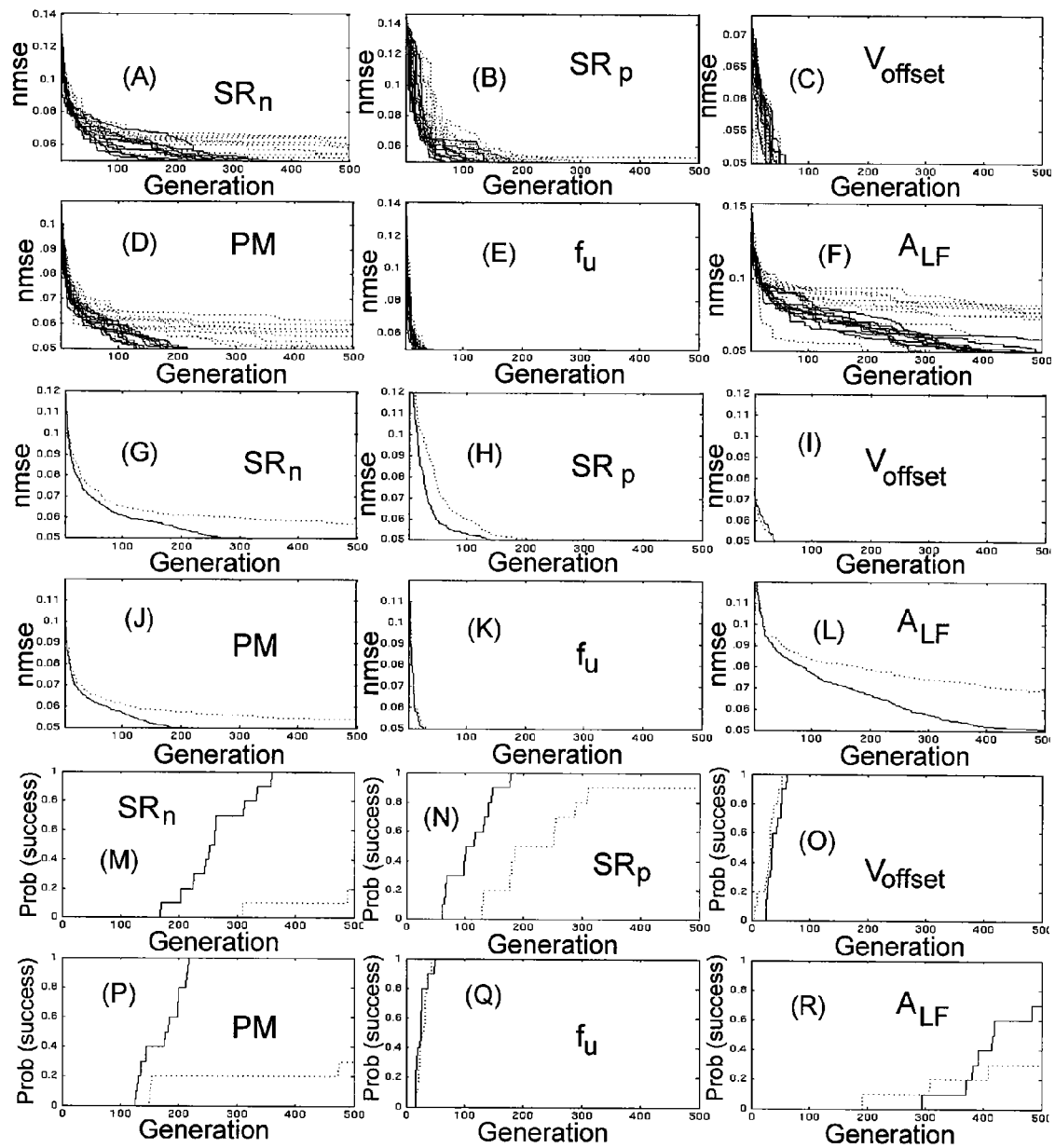
FIGS. 13 (A) to (R) show comparison graph of electrical characteristics of the circuit of FIG. 4 modeled using CAFFEINE and Double-Strength CAFFEINE.

It is not straightforward since different sub-functions may be of different depth, arity, etc. Introns provide the answer as follows. The idea is to put all trees at maximum depth and branchiness, but so that simpler functions remain possible and allow sub-functions to be turned off, by merely setting that sub-function's exponent to zero. The same principle applies to variable combo exponents, and weights. There are still symbols inside the subfunctions, but they do not get expressed. Thus, we have explicit introns. Now, since all individuals' trees have the same number of symbols, they can truly be represented as a fixed-length string. FIG. 12 illustrates the representation.

The canonical functional form is now implicitly followed. Equivalent types are aligned on a bitstring: the sums of basis functions, the nonlinear operators, the arguments within the operators, etc. Due to this, one can perform simple string-style uniform crossover on them. Furthermore, having the symbols line up means that the "behavioral bridge" is maintained, thereby achieving smoothness in crossover.

While it has an underlying hierarchical structure that follows the functional form of FIG. 4, it can be treated as a fixed-length string of symbols too, to make uniform crossover possible. This tree/string duality puts it in a gray area between GP and genetic algorithms (which have fixed-length bit-strings).

The VC0 symbol is a depth-0 Poly/Ratl varcombo, and VP0 is a varcombo pair consisting of a VV0 variable name and VE0 variable exponent. There are max_num_interacting_vars of these VP's for each VC. OPE is the operator exponent. The operator name is implicit based on its position; each operator gets a place in each basis function. Inside each operator OP is a list of arguments (ARGs). Each ARG has an offset weight (OW2) and a set of weight-VC tuples (VCW2 plus the usual VC representation). Introns occur anytime a VE0, OPE, VCW2, or VV2 is zero.

A concern is that introns create a search space with too many dimensions. So we use domain knowledge to prune the space. First, we note that our operators always have arity of 1 or 2, which means exponential growth as depth grows is reasonable. Also, even though the focus application is sizing, maintaining the constraint of "interpretability" from, e.g., T. McConaghy, T. Eeckelaert, G. Gielen, "CAFFEINE: Template-Free Symbolic Model Generation of Analog Circuits via Canonical Form Functions and Genetic Programming", *Proc. DATE* 2005, March 2005, acts as a useful surrogate to reduce overfitting. Using that, it was decided never to embed one nonlinear operator into another one. Finally, an interpretable design has a limit on how many variables interact, so we change the design of varcombos from an exponent for each variable, to a list of {variable name, variable exponent) pairs.

With the representation in place, it is now possible to design smooth mutation operators for functions. They are as follows. Change real-valued weights by a small amount; delete basis functions with near-zero weights; copy a basis function, then mutate the new basis function (and let linear learning determine weight allocation). Other mutations are less smooth, yet still small: changing the exponent of a single variable or nonlinear operator; changing a variable name, setting any weight to zero (akin to deletion, and simultaneously, intron insertion); copying a varcombo into another varcombo location. Finally there are the neutral mutations that naturally occur inside introns: swap the order of whole basis functions within an individual; and swap the order of basis functions inside a nonlinear operator. The following shows experimental results.

The same test setup as in T. McConaghy, T. Eeckelaert, G. Gielen, "CAFFEINE: Template-Free Symbolic Model Generation of Analog Circuits via Canonical Form Functions and Genetic Programming", *Proc. DATE* 2005, March 2005. The circuit being modeled is a high-voltage CMOS OTA as shown in FIG. 4. The goal is to discover expressions for low-frequency gain ($A_{LF}$), unity-gain frequency ($f_u$), phase margin (PM), inputreferred offset voltage ($V_{offset}$), and the positive and negative slew rate ($SR_p$, $SR_n$). There are 13 design variables. Full orthogonal-hypercube Design-Of-Experiments sampling was used, with scaled range dx=0.1 to have 243 samples from simulation.

The settings for both CAFFEINE and Double-Strength CAFFEINE were identical. Operators: $\sqrt{x}$, $\log10(x)$, $1/x$, abs(x), $x^2$, 10x, $\max(x_1,x_2)$, $\min(x_1,x_2)$. Maximum number of basis functions=7, population size 200, stop when 500 generations or target nmse of 0.05 hit, varcombo exponents in [−3,−2,−1,−⅓,−½,0,⅓,½,1,2,3], and weights in [−1e+10,−1e−10]∪[0]∪[1e−10,1e+10]. CAFFEINE's maximum tree depth was 7, therefore allowing just one layer of nonlinear operators. All operators had equal probability, except parameter mutation was 5× more likely. Ten runs were done, for each performance goal, on both the old and proposed algorithm, for a total of 10*6*2=120 runs.

FIGS. 13(A)-(F) show the error vs. time for each of the ten runs, six problems, and both algorithms. We see that both algorithms converge towards the target nmse of 0.05 (5%), but it is apparent that Double-Strength CAFFEINE is doing better especially on the more challenging problems ($SR_n$, PM, $A_{LF}$). Whereas CAFFEINE often tapers off, Double-Strength CAFFEINE aggressively charges on. Such behavior is attributable to the combination of smooth, uniform operators and introns (which together, allow refinement of structure, allow easy access to other regions of search space, and bypass local optima). FIGS. 13(G)-(L), show the normalized mean square error averaged over all ten runs per performance characteristic and highlights the difference in convergence behavior on the challenging problems.

The measure of speedups is based on the number of individuals (or equivalently, generations) to meet the target nmse. FIGS. 13(M)-(R) allows to visualize this measure, shown as a probability of success vs. the number of generations. For $SR_n$, we see that CAFFEINE was successful just twice, snagging the last success in its final generations. In contrast, Double-Strength CAFFEINE already had two successes within 250 generations, and by generation 400 was 100% successful. The difference was even more pronounced in the PM modeling problem, where Double-Strength CAFFEINE had chalked up 100% success by generation 250, whereas CAFFEINE barely chalked up 30% success in running twice as long. In $A_{LF}$, CAFFEINE for once stole an early lead, but had forfeited that by generation 400 and by generation 500 had only half the success rate of Double-Strength CAFFEINE.

Table 3 shows the average number of generations to success (in successful runs), the probability of success, and divides them to get the effective number of generations to solve a given problem. Speedup is the ratio of the effective number of generations, from old to new. The average speedup is 3.0×, and on challenging problems the average speedup is 5.0×. Generally, the harder a problem was for CAFFEINE, the more the speedup with Double-strength CAFFEINE. This makes the double-strength CAFFEINE approach fast enough for automated circuit sizing applications.

TABLE 3

Speedups. Average is 3.0×; on challenging problems, denoted by *, average is 5.0×.

| | CAFFEINE | | | Double-Strength CAFFEINE | | | |
| --- | --- | --- | --- | --- | --- | --- | --- |
| Metric | Avg. # gen. when succ. | p(succ) | Eff. # gen | Avg. # gen. when succ. | p(succ) | Eff. # gen | Speedup |
| $A_{LF}$* | 303 | 0.3 | 1010 | 394 | 0.7 | 563 | 1.8× |
| PM* | 260 | 0.3 | 867 | 173 | 1.0 | 173 | 5.0× |

TABLE 3-continued

Speedups. Average is 3.0×; on challenging problems, denoted by *, average is 5.0×.

| Metric | CAFFEINE | | | Double-Strength CAFFEINE | | | |
|---|---|---|---|---|---|---|---|
| | Avg. # gen. when succ. | p(succ) | Eff. # gen | Avg. # gen. when succ. | p(succ) | Eff. # gen | Speedup |
| $SR_n$* | 399 | 0.2 | 1995 | 263 | 1.0 | 263 | 7.6× |
| $SR_p$ | 213 | 0.9 | 237 | 111 | 1.0 | 111 | 2.1× |
| $V_{offset}$ | 30 | 1.0 | 30 | 39 | 1.0 | 39 | 0.8× |
| $f_u$ | 29 | 10 | 29 | 26 | 1.0 | 2.6 | 1.1× |

The present invention also relates to dynamic modeling of circuits. Fast, effective system-level analog design practices are becoming increasingly important due to the rise in the use of mixed signal integrated circuits (ICs) and communication circuits in particular. How sub-circuits are modeled for design and verification influences speed and risk of system-level design. Using SPICE to simulate a single system-level design can easily take hours or days, which makes verification painful and automated sizing infeasible.

A potential means to speed up simulation is via behavioral models which approximate the dynamic behavior of sub-circuits but simulate orders of magnitude faster (e.g., see G. Gielen, R. A. Rutenbar, "Computer aided design of analog and mixed-signal integrated circuits," Proc. of the IEEE Vol. 88(12), 2000, pp. 1825-1849). These models can be manually created, which makes them understandable (because they are interpretable expressions, and a person generated them), and somewhat trustworthy. However, creating such models can take weeks to years and even then, the validity of the model could expire when new technologies emerge.

An alternative is to generate models automatically with approaches such as Model order reduction (MOR) and regression. MOR uses projections to transform the system's states into a smaller set that retain the essence of the system's behavior. Early MOR research focused on linear circuits, but more recent research has tackled weakly non-linear circuits and finally strongly non-linear circuits. A survey of these is shown in J. Roychowdhury, "Automated macromodel generation for electronic systems," BMAS 2003, San Jose, Calif.

For nonlinear circuits, piecewise linear (e.g., see M. Rewienski, J. White, "A trajectory piecewise-linear approach to model order reduction and fast simulation of nonlinear circuits and micromachined devices," Proc. ICCAD 2001, San Jose, Calif., 2001, pp. 252-257) and piecewise polynomial approaches (e.g., see N. Dong, J. S. Roychowdhury, "Piecewise polynomial nonlinear model reduction," DAC 2003: 484-489) each tie together a group of linear or polynomial models along likely trajectories in state space. Kernel methods (e.g., see J. R. Phillips, J. Afonso, A. L. Oliveira, L. M. Silveira, "Analog macromodeling using kernel methods," ICCAD 2003, pp. 446-453; and J. R. Phillips, "A statistical perspective on nonlinear model reduction," BMAS 2003, San Jose, Calif.) transform the non-linear state space into a high-dimensional linear feature space which is more readily handled. MOR uses the circuit's internal dynamics to retain some trust; however, since they are not interpretable they can be less preferable to many designers. Also, they are subject to the biases imposed by the particular choice of regression. Specifically, polynomials extrapolate poorly; distance-based kernels (e.g. radial basis kernels) and inner product kernels place equal importance on all state variables even though some state variables may affect the dynamics far more than others. That is why J. R. Phillips, J. Afonso, A. L. Oliveira, L. M. Silveira, "Analog macromodeling using kernel methods," ICCAD 2003, pp. 446-453 mentions high sensitivity of model error to the scaling of the state variables. Finally, nonlinear MOR approaches divide the problem into two sub-problems that are solved sequentially (finding a projector, finding the corresponding regressor); the only way this division could be optimal is if the two sub-problems are completely independent, and there is no reason to believe this is so. Thus, the approaches sacrifice their chances of optimality, most notably the compressibility aspect (which directly influences interpretability).

On the other hand, regression or "black-box" approaches create models that learn from the simulation waveforms of the circuit's inputs and outputs (e.g., see D. E. Root, J. Wood, N. Tufillaro, "New techniques for nonlinear behavioral modeling of microwave/RF ICs from simulation and nonlinear microwave methods," DAC 2004). The topology and internal states of the circuit are not considered. As the problem is not sub-divided into sub-problems, it has (at least the theoretical) opportunity to optimally capture the dynamics. The models can be compact. However, they are not interpretable, which impedes designer trust. Because they do not aim to project the dynamics of the detailed system onto a smaller system, they do not "gain back" some trust.

The following presents an Interpretable Behavioral Model Generator (IBMG), which uses GP, which evolves functions, but modified so that differential equations follow a special canonical form. As will be shown, trust is gained because the models are readily-interpretable equations. IBMG creates compositions of functions that best fit the problem at hand; i.e. is not constrained to any specific basis function nor any predefined functional template.

A p-input, q-output, nonlinear dynamical system, specifically a circuit, is assumed to have the form:

$$\frac{dx}{dt} = f(x(t), u(t)) \qquad (2)$$
$$y(t) = Ez(t) + Du(t)$$

where x(t) is the system's n-dimensional state (i.e. node voltages and branch currents in the circuit), u(t) is the p inputs at time t, and y(t) is the q outputs at time t. f(x, u) is an arbitrary nonlinear function vector field that describes how the state changes. y(t) is a linear function of x(t) and u(t).

The task of the behavioral modeling system is to create a more compact form of the given dynamical system, i.e. one with m states where m<<n. The model must be interpretable behavioral expressions, i.e. easily readable functional forms that describe how the state changes. Finally, the approach must have error control by actually generating a set of models that trade off between error and complexity. The generator's inputs are u(t) and y(t), taken from a transient simulation using a standard SPICE simulator. With the aim of interpretability, x(t) is not an input, even though it creates a more difficult learning problem. The expressions to be generated must take the following form.

$$\frac{dz}{dt} = g(z(t), u(t)) \quad (3)$$
$$y(t) = Ez(t) + Fu(t)$$

where z is the system's state, and g, E, and F are the reduced-system equivalents of f, C, and D respectively. Initial system state is set to be $z(0)=(0,0,\ldots)$. IBMG must "learn" the vector valued function $g(z, u)$ as well as E and F. Learning E and F is merely a set of linear learning problems (one for each output variable) once z(t) for each t is known. Learning $g(z, u)$ is the major challenge, as each point g in the search space of possible Gs involves a choice of the number of basis functions, and the functional form of each of those basis functions (which takes the other basis functions and u as an input). Any possible composition of functions is allowed.

The problem could have been formulated more generally, i.e. y as a nonlinear function of x and u. But IBMG approximates nonlinear mappings via state variables that do not appear in f( ), which relate x and u to y in a nonlinear fashion. In making this choice we simplify IBMG and also encourage re-use of expressions for outputs.

The set goals is to generate a set of models that trade off according to the following.

$$\begin{cases} \text{minimize} & nmse_{tot}(y, y_h) \\ \text{minimize} & complexity(h) \end{cases} \quad (4)$$
$$h \in H$$

where h is a model in model space H; a given h is composed of a g, E, and F. $nmse_{tot}$ is defined as $$nmse_{tot}(y, y_g, dy, dy_g) = \frac{1}{p}\sum_{i=1}^{p}\frac{1}{2}(nmse(y, y_g) + nmse(dy, dy_g)) \quad (5)$$

where $dy(t)=y(t)-y(t-dt)$ and nmse follows the usual definition:

$$nmse(y_{ref}, y_2) = \frac{1}{len(y_{ref})}\sqrt{\sum_{j=1}^{len(y_{ref})}\left(\frac{y_{ref}(j) - y_2(j)}{\max(y_{ref}) - \min(y_{ref})}\right)^2} \quad (6)$$

where len(y) is the number of samples in y.

As mentioned previously, GP is an evolutionary algorithm, with the distinguishing characteristic that GP individuals (points in the design space) are trees. While GP has been used previously to evolve differential equations (e.g., see H. Cao, L. Kang, Y. Chen, J. Yu, "Evolutionary Modeling of Ordinary Differential Equations with Genetic Programming," Genetic Programming and Evolvable Machines 1(4), October 2000, pp. 309-337), the present invention is the first to have an up-front emphasis on interpretability, to create tradeoffs of complexity and error, and to model circuits. The functional form of results from canonical GP is completely unrestricted, hindering interpretability. This is exacerbated by the observation that GP-evolved functions tend to bloat with improved fitness (e.g., see W. B. Langdon, R. Poli, "Fitness Causes Bloat: Mutation," Lecture Notes in Comp. Sci. 1391, Springer, 1998, pp. 37-48). The main challenge with GP is to find a way to restrict the form enough to make the expressions interpretable, without actually constraining away from any possible functional forms.

IBMG uses an altered form of CAFFEINE. CAFFEINE took GP as a starting point, but extended it to properly address creating static mappings that were interpretable. It attacked interpretability via a multi-objective approach that provides a tradeoff between error and complexity, and most notably a specially designed grammar to constrain search to specific functional forms. As done in CAFFEINE, IBMG uses the multi-objective evolutionary algorithm NSGA-II to generate a set of models that, collectively, trade off $nmse_{tot}$ and complexity. "Complexity" is dependent on the number of basis functions, the number of nodes in each tree, and the exponents of "variable combos". It is measured as shown previously in equation (1).

IBMG can do simplification during generation, as is known in the art, via pressure to lower complexity. The user avoids a priori decisions on the error and complexity because IBMG provides a tradeoff set of alternatives.

As seen above, CAFFEINE includes a carefully designed grammar specifically for modeling functional forms. The grammar allows all functional compositions, but in just one canonical form. A CAFFEINE individual consisted of a set of trees. The root node of each tree (basis function) was a product of sums; and the weights on the basis functions could be linearly learned from y. In IBMG, however, the usage of the set of basis functions is different: the expressions are simulated in a dynamic fashion, starting from an initial state $z(0)$, and each the change in state $dx/dt$ at time t is a function of the current state $x(t)$ and inputs $u(t)$. Thus, linear weights on the basis functions cannot be determined by linear learning. This means that the form for the root should be more open-ended; it can be either a weighted sum of basis functions or a product of variables and/or nonlinear functions. Once the system is simulated, which computes $z(t)$ for each t, then linear learning can be employed on z and y to determine E and F. Accordingly, the IBMG grammar makes just one adjustment to the CAFFEINE grammar: it adds the first line in the grammar. An example of IBMG grammar is as follows.

```
ROOTSYM => W + REPADD | REPVC
REPVC => VC | REPVC * REPOP | REPOP
REPOP => REPOP * REPOP | 1OP ( W + REPADD ) |
    2OP( 2ARGS ) | ... (3OP, 4OP etc)
2ARGS => W + REPADD, MAYBEW | MAYBEW, W + REPADD
MAYBEW => W | W + REPADD
REPADD => W * REPVC | REPADD + REPADD
2OP => DIVIDE | MAX | ...
1OP => INV | LOG10 | ...
```

REPVC and REPOP are respectively a product of variables and/or nonlinear functions. Within each nonlinear function is a weighted sum of basis functions (REPADD). Each basis function can be, once again, a product of variables and/or nonlinear functions. IBMG treats basis function operators slightly different than CAFFEINE because expression inputs are more tightly tied to the basis functions. In CAFFEINE the order of the basis functions was not important because the output was a weighted sum. In IBMG, the location i of a basis function describes the state variable z(i) that it updates. With this in mind, basis function operators include: uniform crossover of basis functions from two parents; deleting a random basis function (therefore making its location empty); adding a randomly generated tree as a basis function; copying a subtree from one individual to make a new basis function for another.

The IBMG grammar is context-free, with two exceptions for the sake of enhanced search: weights and variable combinations (VCs). At each weight (W) node, a real value is stored in the range [−2*B,+2*B]. During interpretation of the tree the value is transformed into [−1e+B,−1e−B]∪[0.0]∪[1e−B, 1e+B]. B is user-set, e.g. 10. In this way parameters can take on very small or very large negative or positive values. Cauchy mutation is the operator. Each VC has an accompanying vector that has one integer value per variable as the variable's exponent. There is one variable for each of the p system inputs and one variable for each of the basis functions in the candidate model. For interpretability, only integer exponents are allowed. VC operators include: one point crossover, and randomly adding or subtracting to an exponent value.

A prototype IBMG system was written in about 2000 lines of Matlab code. The grammar was defined in a separate text file. Run settings were: maximum number of basis functions 10, population size 250, number of generations 1500, maximum tree depth 8, weight setting B=4, complexity measure settings $w_b$=10, $w_{vc}$=0.25. All operators had equal probability, except parameter mutation was five times more likely. Single-input operators allowed were: $\sqrt{x}$, loge(x), log10(x), 1/x, abs(x), $x_2$, sin(x), cos(x), tan(x), max(0, x), and min(0,x), 2x, 10x, where x is an expression. Dual-input operators allowed are $x_1+x_2$, $x_1*x_2$, max($x_1,x_2$), min($x_1,x_2$), power($x_1$, $x_2$), and $x_1/x_2$. Also, Ite(testExpr, condExpr, exprIfTestLessThanCond, elseExpr) and Ite(testExpr, 0, exprIfTestLessThan0, elseExpr) were used, along with "greater than". While it was possible to turn off any unwanted rules or operators, e.g. to restrict the search to linear functions or rationals, the search was kept open-ended. Experiments are on a 3.0 GHz Pentium IV PC running Matlab 6.5 on Red Hat Linux.

Figure 14:
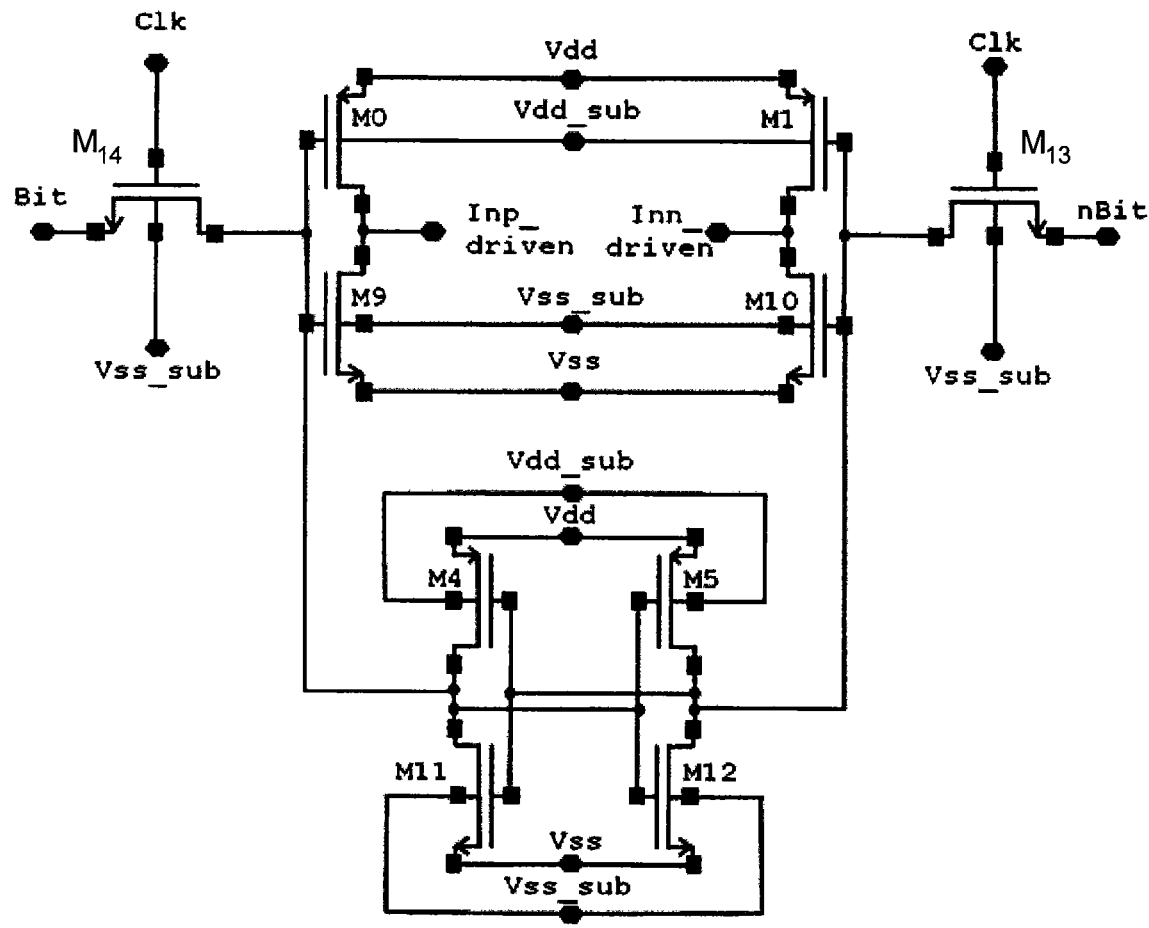
FIG. 14 is a schematic representation of a latch circuit.
Figure 15:
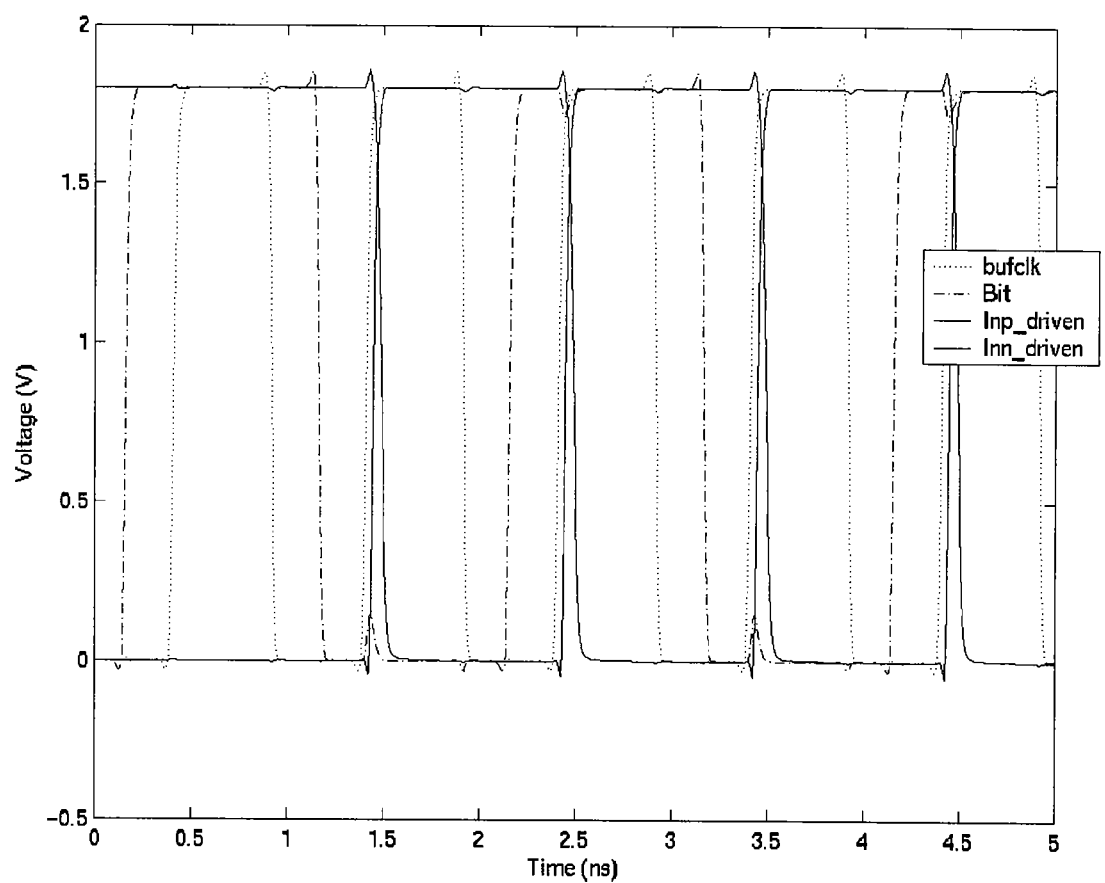
FIG. 15 shows the input and output waveforms of the circuit of FIG. 14.

To test IBMG, the strongly nonlinear circuit of FIG. 14, a latch used in a DAC system similar to, e.g., J. Deveugele, M. Steyaert, "A 10b 250MS/s binary-weighted current-steering DAC," ISSCC 2004, was modeled. It synchronizes the digital, differential input data at nodes Bit-nBit with the clock Clk. Bit, nBit and Clk have been passed through buffers. All the transistors except M14 and M13 form a David-Goliath (strong-weak) inverter structure. The David inverters regenerate the signals on the gates of M0/M1/M9/M10 and hold them while the pass transistors M14 and M13 are off. The technology is 0.18 μm CMOS. Vdd, Vdd_sub, Vss, and Vss_sub are 1.8V, 1.8V, 0.0V, and 0.0V respectively. FIG. 15 shows the circuit's input and output waveforms. IBMG's goal is to build a model that produces similar outputs given those same inputs. Vdd and Vss are also treated as inputs to IBMG. Each waveform had 2001 samples.

Figure 16:
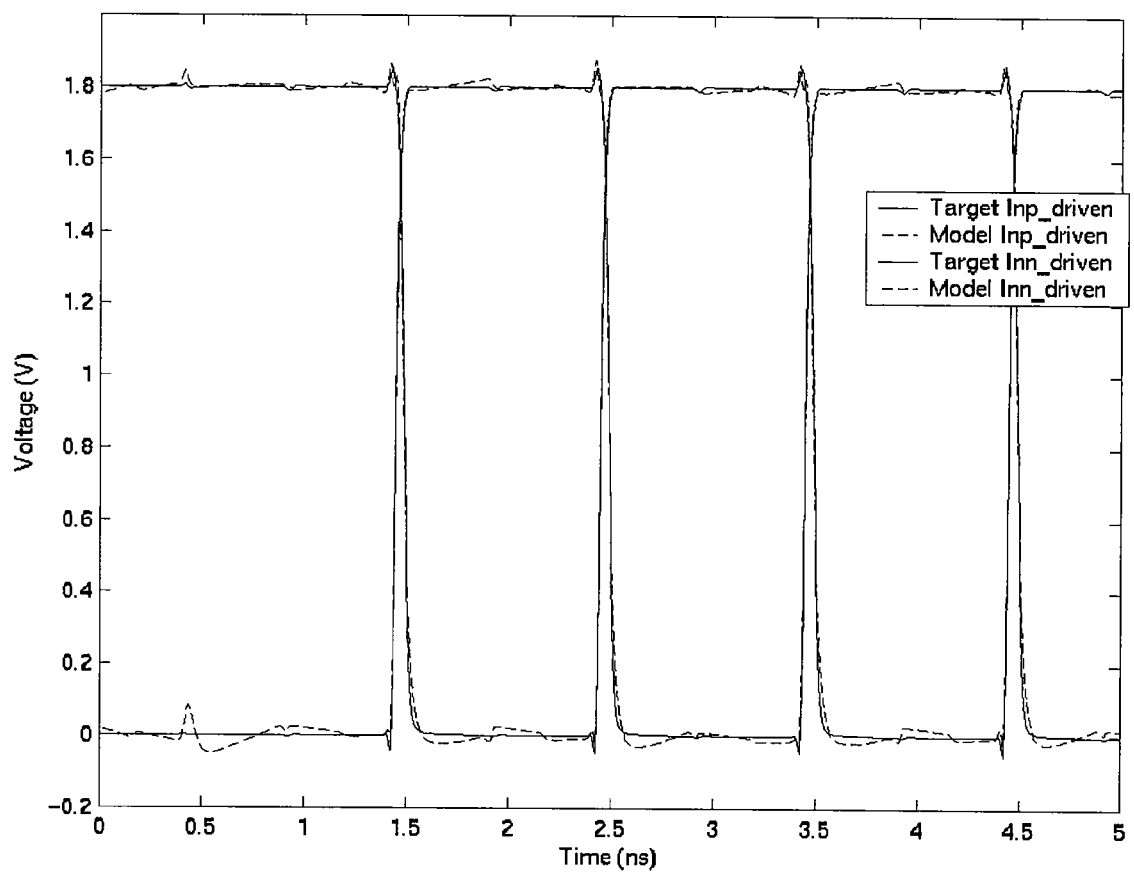
FIG. 16 shows modeled waveforms for the circuit of FIG. 14.

IBMG was run to build models for the latch circuit of FIG. 14. Runtime was 72 hours (a compiled implementation would be about an order of magnitude faster). FIG. 16 shows the best-performing result, which achieved $nmse_{tot}$ of 1.31%. This is a fairly tight fit, especially given that IBMG did not use the circuit's internal state information and instead had to invent its own states and state transition equations. Examining the waveform, we see that the sharp nonlinear transitions are handled quite gracefully, though the model output jumps around somewhat at around 0.5 ns. The output is fairly smooth over time in part thanks to minimization of error of derivatives. Thus, IBMG has accomplished the error-minimization goal.

Figure 17:
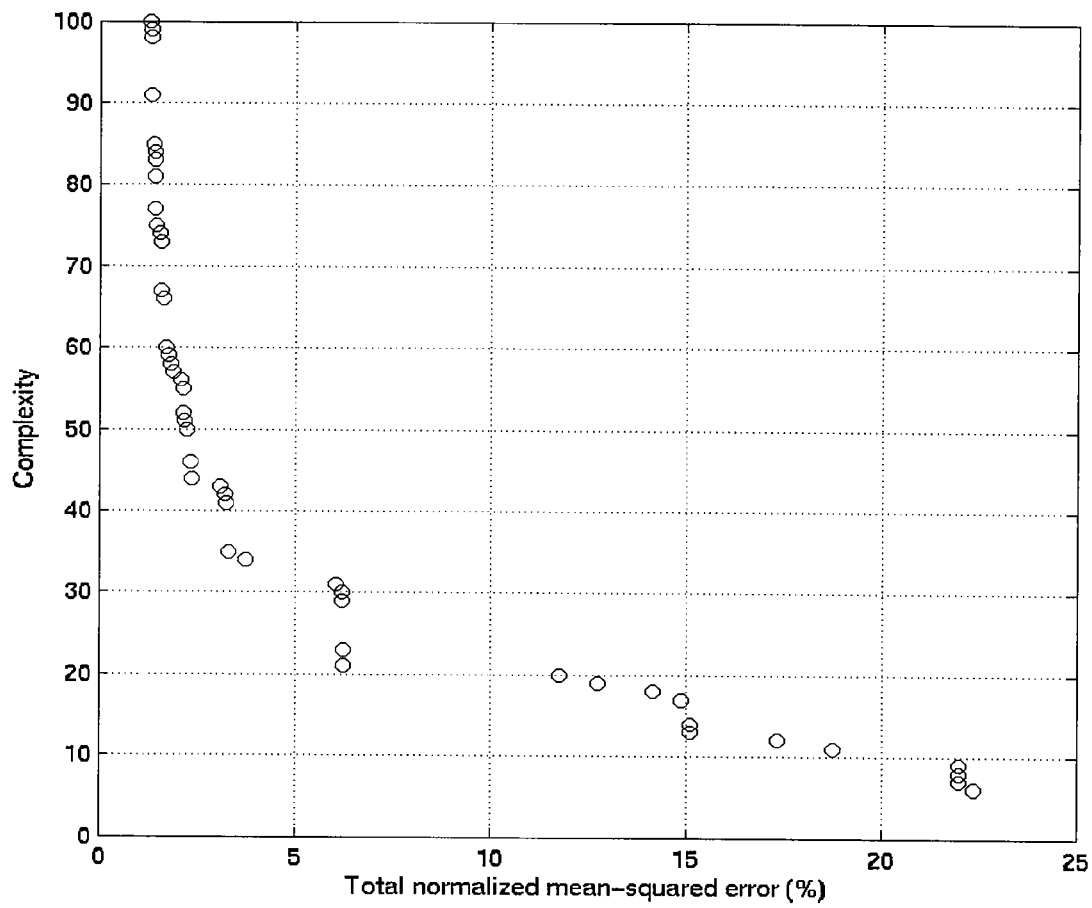
FIG. 17 shows a plot of complexity vs. error for models related to the circuit of FIG. 14.

FIG. 17 shows the outcome of IBMG's error-control strategy: a set of about 50 behavioral models that collectively trade off model complexity with error. Table 4 shows some IBMG models. The most complex one, in the bottom row, achieved 1.31% error, yet is readily interpretable. It effectively only has two state variables ($x_1$ and $x_{10}$); the other six only act to create nonlinear mappings from x and u to y, which is fine, as section 1 discussed. Interestingly, polynomials almost exclusively dominated the final models, though some expressions had max and some intermediate results with error less than 2.0% had used Ite0 and square. This is reasonable, as polynomials are among the smoothest, simplest expressions.

TABLE 4

Some behavioral models of the latch
of FIG. 14 generated by IBMG

| % error | Expression |
|---|---|
| 15.1 | $dx_1/dt$ = nBit, $dx_2/dt$ = Bit * $x_1$ |
| 6.25 | $dx_1/dt$ = −21.3 − 9.28e−03 * bufclk * $x_1$ + 1.0e+04 * nBit * bufclk |
| 3.32 | $dx_1/dt$ = 2.21e−02 − 3.72e−02 * $x_1$ − 21.8 * Bit*nBit * bufclk<br>$dx_2/dt$ = nBit * bufclk * $x_1$, $dx_6/dt$ = $x_1$ |
| 1.31 | $dx_1/dt$ = 78.2 + 1.06e−03 * Bit * $x_1$ − 2.11e−02 * bufclk * $x_1$ −4.85*Bit*nBit * bufclk * $x_{10}$<br>$dx_2/dt$ = nbit * bufclk * $x_1$<br>$dx_3/dt$ = $x_1$<br>$dx_4/dt$ = Bit * nBit * bufclk * $x_1$ * $x_{10}$<br>$dx_6/dt$ = Bit * nBit * bufclk * $x_1$<br>$dx_8/dt$ = Bit * nBit * bufclk<br>$dx_9/dt$ = bufclk * $x_1$<br>$dx_{10}/dt$ = 25.9 + 1.44e−04 * Bit * $x_1$ − 1.89e−03 * $x_{10}$ |

Thus, IBMG is an approach to generate behavioral models of nonlinear analog circuits, with the special distinction that the models are compact, interpretable expressions that are not restricted to any pre-defined functional templates. The key is the use of a specialized grammar within the context of genetic programming.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

To summarize, the present invention provides a system and method for generating human-interpretable symbolic expressions of performance characteristics of a system, without the use of pre-determined templates for the symbolic expressions. Any sufficiently general search algorithm, such as, for example, genetic programming, simulated annealing and Tabu searching can be used. In the case of genetic programming, it is used to traverse the space of possible symbolic expressions, and a set of rules is used to constrain the search to expressions having a pre-defined canonical form.

Embodiments of the invention were shown in relation to non-linear electrical circuits and symbolic expressions describing their static and dynamic behavior. However, the method and system of the present invention is also applicable to systems other than electrical systems. For example, financial systems and weather systems, amongst others, can also use the method and system described herein.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A tangible computer-readable medium having recorded thereon statements and instructions for execution by a computer of a method to generate at least one mathematical expression describing a performance characteristic of a system, the system associated with variables and with pre-determined data related to the performance characteristic of the system, the method comprising steps of:
generating at least one initial mathematical expression having a pre-defined canonical form and being a function of the variables, the at least one initial mathematical expression having operators operating on the variables, the operators being selected from a pre-defined group of operators, the at least one initial mathematical expression describing the performance characteristic of the system;
wherein, the variables of the system are representable as a vector $\vec{x}$ and the canonical form of an expression $F(\vec{x})$ is representable as $$F(x) = w_{\text{offset}} + \sum_{i=0}^{n} w_i \times f_i(x) \times NL_i(x),$$

"n" being an integer, $w_{\text{offset}}$ being an offset value, $w_i$ being weights, $f_i(x)$ including at least one of a polynomial function of the variables and a rational function of the variables, and $NL_i(\vec{x})$ being a non-linear function of the variables, with $NL_0(x)=1$;
generating calculated data using the at least one initial mathematical expression;
calculating an output of a goal function in accordance with the pre-determined data and the calculated data;
determining that the goal function is outside a pre-defined range; and
iteratively performing the following steps a-c until an additional output of the goal function is within the pre-defined range:
a. modifying at least one input mathematical expression in accordance with a search algorithm to produce at least one modified mathematical expression having the canonical form and being a function of the variables, the search algorithm to search at least the pre-defined group of operators to identify operators with which to modify the at least one input mathematical expression, the at least one input mathematical expression being the at least one initial mathematical expression in a first iteration of steps a-c, the at least one input mathematical expression being the at least one modified mathematical expression in subsequent iterations of steps a-c;
b. generating additional calculated data using the at least one modified mathematical expression; and
c. calculating the additional output of the goal function based on the additional calculated data and the pre-determined data.

2. The tangible computer-readable medium of claim 1 wherein, the goal function is a single objective goal function for minimizing error.

3. The tangible computer-readable medium of claim 1 wherein, the goal function is a multi-objective goal function for minimizing error and for minimizing complexity.

4. The tangible computer-readable medium of claim 1 wherein, the goal function is a multi-objective goal function for minimizing error and for constraining complexity.

5. The tangible computer-readable medium of claim 1 wherein, the goal function is a multi-objective goal function for constraining error and for constraining complexity.

6. The tangible computer-readable medium of claim 1 wherein, the goal function is at least for minimizing a normalized root mean square error between the pre-determined data and either the calculated data generated using the at least one initial mathematical expression or the additional calculated data generated using the at least one modified mathematical expressions.

7. The tangible computer-readable medium of claim 1 wherein, the step of modifying the at least one input mathematical expression in accordance with a search algorithm includes modifying the at least one input mathematical expression in accordance with an evolutionary search algorithm to produce the at least one modified mathematical expression.

8. The tangible computer-readable medium of claim 1 wherein, the step of modifying the at least one input mathematical expression in accordance with a search algorithm includes modifying the at least one input mathematical expression in accordance with a simulated annealing search algorithm to produce the at least one modified mathematical expression.

9. The tangible computer-readable medium of claim 1 wherein, the step of modifying the at least one input mathematical expression in accordance with a search algorithm includes modifying the at least one input mathematical expression in accordance with a Tabu search algorithm to produce the at least one modified mathematical expression.

10. The tangible computer-readable medium of claim 7 wherein, the goal function is an evolutionary multi-objective goal function.

11. The tangible computer-readable medium of claim 1 wherein, a step of simplifying the at least one modified mathematical expression is performed before generating additional calculated data.

12. The tangible computer-readable medium of claim 11, wherein the step of simplifying is done in accordance with a predicted sum of squares statistic process.

13. The tangible computer-readable medium of claim 7 wherein, the at least one initial mathematical expression and the at least one modified mathematical expressions are representable as trees, the trees having a pre-determined depth and a pre-determined branchiness, some of the at least one initial mathematical expression and the at least one modified mathematical expressions having introns.

14. The tangible computer-readable medium of claim 7 wherein, the step of generating at least one initial mathematical expression and the step of modifying the at least one input mathematical expression are performed in accordance with genetic programming principles.

15. The tangible computer-readable medium of claim 1 wherein, the system is an electrical system.

16. The tangible computer-readable medium of claim 1 wherein, the variables associated with the system include at least one of design variables, environmental variables and random variables.

17. A tangible computer-readable medium having recorded thereon statements and instructions for execution by a computer of a method to model an electrical circuit, the electrical circuit associated with circuit variables, with pre-determined data, with at least one pre-determined transient input waveform and with at least one pre-determined transient output waveform the method comprising steps of:

generating at least one initial mathematical expression dependent on at least one of at least one of the variables, at least one of the at least one pre-determined transient input waveform and at least one of the least one pre-determined transient output waveform, the at least one initial mathematical expression having a pre-defined canonical form, the at least one initial mathematical expression having operators operating on the variables, the operators selected from a pre-defined group of operators, the at least one initial mathematical expression describing a transient behavior of the electrical circuit;

wherein, the variables of the system are representable as a vector $\vec{x}$ and the canonical form of an expression $F(\vec{x})$ is representable as $$F(x) = w_{Offset} + \sum_{i=0}^{n} w_i \times f_i(x) \times NL_i(x)$$

"n" being an integer, $w_{offset}$ being an offset value, $w_i$ being weights, $f_i(\vec{x})$ including at least one of a polynomial function of the variables and a rational function of the variables, and $NL_i(\vec{x})$ being a non-linear function of the variables, with $NL_0(\vec{x})=1$;

generating calculated data using the at least one initial mathematical expression;

calculating an output of a goal function in accordance with the pre-determined data and the calculated data;

determining that the goal function is outside a pre-defined range: and iteratively performing the following steps a-c until an additional output of the goal function is within the pre-defined range:

a. modifying at least one input mathematical expression in accordance with a search algorithm to produce at least one modified mathematical expression dependent on at least one of at least one of the variables, at least one of the at least one pre-determined transient input waveform and at least one of the least one pre-determined transient output waveform, the at least one modified mathematical expression having the canonical form, the search algorithm to search at least the pre-defined group of operators to identify operators with which to modify the at least one input mathematical expression, the at least one input mathematical expression being the at least one initial mathematical expression in a first iteration of steps a-c, the at least one input mathematical expression being the at least one modified mathematical expression in subsequent iterations of steps a-c;

b. generating additional calculated data using the at least one modified mathematical expression; and c. calculating the additional output of the goal function based on the additional calculated data and the pre-determined data.

18. The tangible computer-readable medium of claim 17 wherein, the pre-determined data includes at least one of steady-state electrical circuit data, transient electrical circuit data and noise electrical circuit data.

19. The tangible computer-readable medium of claim 17 wherein, the electrical circuit is nonlinear.

20. The tangible computer-readable medium of claim 17 wherein, the at least one initial mathematical expression and the at least one modified mathematical expression are independent of a connectivity topology of the electrical circuit.

21. The tangible computer-readable medium of claim 17 wherein, the at least one initial mathematical expression and the at least one modified mathematical expression are symbolic models of the electrical circuit.

22. The tangible computer-readable medium of claim 17 wherein, the at least one initial mathematical expression and the at least one modified mathematical expression are behavioral models of the electrical circuit.

* * * * *

UNITED STATES PATENT AND TRADEMARK OFFICE
CERTIFICATE OF CORRECTION

PATENT NO. : 8,332,188 B2  
APPLICATION NO. : 11/682089  
DATED : December 11, 2012  
INVENTOR(S) : Trent Lorne McConaghy It is certified that error appears in the above-identified patent and that said Letters Patent is hereby corrected as shown below:

Column 23, Claim 1, line 55 delete

" $F(x) = w_{offset} + \sum_{i=0}^{n} w_i \times f_i(x) \times NL_i(x)$ "

and insert therefor

-- $F(\vec{x}) = w_{offset} + \sum_{i=0}^{n} w_i \times f_i(\vec{x}) \times NL_i(\vec{x})$ --

Column 23, Claim 1, line 60, delete " $f_i(x)$ " and insert therefor -- $f_i(\vec{x})$ --

Column 23, Claim 1, line 63, delete " $NL_0(x) = 1$ " and insert therefor -- $NL_0(\vec{x}) = 1$ --

Column 25, Claim 17, line 50, delete

" $F(x) = w_{offset} + \sum_{i=0}^{n} w_i \times f_i(x) \times NL_i(x)$ "

and insert therefor

-- $F(\vec{x}) = w_{offset} + \sum_{i=0}^{n} w_i \times f_i(\vec{x}) \times NL_i(\vec{x})$ --

Signed and Sealed this  
Second Day of April, 2013

Teresa Stanek Rea  
*Acting Director of the United States Patent and Trademark Office*